US010867944B2

(12) United States Patent
Wu

(10) Patent No.: US 10,867,944 B2
(45) Date of Patent: Dec. 15, 2020

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventor: Tung-Jiun Wu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/366,858

(22) Filed: Mar. 27, 2019

(65) Prior Publication Data

US 2020/0312800 A1    Oct. 1, 2020

(51) Int. Cl.
*H01L 23/52* (2006.01)
*H01L 23/00* (2006.01)

(52) U.S. Cl.
CPC .............. *H01L 24/05* (2013.01); *H01L 24/03* (2013.01); *H01L 24/11* (2013.01); *H01L 24/13* (2013.01); *H01L 2224/02141* (2013.01); *H01L 2224/02206* (2013.01); *H01L 2224/03916* (2013.01); *H01L 2224/0401* (2013.01); *H01L 2224/05005* (2013.01); *H01L 2224/05017* (2013.01); *H01L 2224/05558* (2013.01); *H01L 2224/05559* (2013.01); *H01L 2224/13021* (2013.01); *H01L 2224/1357* (2013.01); *H01L 2924/35121* (2013.01)

(58) Field of Classification Search
CPC ......... H01L 24/03; H01L 24/05; H01L 24/11; H01L 24/13

USPC .......................................................... 257/737
See application file for complete search history.

(56) References Cited

U.S. PATENT DOCUMENTS

| | | | | |
|---|---|---|---|---|
| 6,426,556 B1* | 7/2002 | Lin | ........................ | H01L 24/03 257/738 |
| 6,815,324 B2* | 11/2004 | Huang | ..................... | H01L 24/03 257/E21.508 |
| 7,364,998 B2* | 4/2008 | Chiu | ........................ | H01L 24/03 438/597 |
| 7,659,632 B2* | 2/2010 | Tsao | ........................ | H01L 24/13 257/778 |
| 7,829,476 B2* | 11/2010 | Nagai | ..................... | H01L 24/05 438/656 |
| 7,952,206 B2* | 5/2011 | Bachman | ................. | H01L 24/05 257/778 |
| 8,354,750 B2* | 1/2013 | Wang | ................... | H01L 23/3192 257/737 |
| 8,987,922 B2 | 3/2015 | Yu et al. | | |

(Continued)

*Primary Examiner* — Luan C Thai
(74) *Attorney, Agent, or Firm* — WPAT, P.C., Intellectual Property Attorneys; Anthony King

(57) ABSTRACT

The present disclosure provides a semiconductor structure, including a substrate, a conductive pad, a passivation layer, a recess, a bump pad, and a conductive bump. The conductive pad is disposed over the substrate. The passivation layer is disposed over the substrate and partially covers the conductive pad. The recess extends through the passivation layer and extends at least partially into the conductive pad. The bump pad is disposed over the passivation layer and within the recess; and the conductive bump is disposed over the bump pad. A method of manufacturing the semiconductor structure is also provided.

20 Claims, 35 Drawing Sheets

(56) References Cited

U.S. PATENT DOCUMENTS

| | | | |
|---|---|---|---|
| 9,024,431 B2 * | 5/2015 | Liu | H01L 23/5329 |
| | | | 257/692 |
| 9,196,532 B2 | 11/2015 | Tu et al. | |
| 9,196,559 B2 | 11/2015 | Tsai et al. | |
| 9,257,333 B2 | 2/2016 | Lu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,372,206 B2 | 6/2016 | Wu et al. | |
| 9,496,189 B2 | 11/2016 | Yu et al. | |
| 9,520,381 B2 * | 12/2016 | Higuchi | H01L 24/13 |
| 9,768,134 B2 * | 9/2017 | Chandolu | H01L 22/20 |
| 2014/0117533 A1 * | 5/2014 | Lei | H01L 24/03 |
| | | | 257/737 |
| 2019/0027453 A1 * | 1/2019 | Kim | H01L 23/3192 |

* cited by examiner

SEMICONDUCTOR STRUCTURE AND MANUFACTURING METHOD THEREOF

BACKGROUND

Recently, semiconductor devices are becoming steadily smaller while having more functionality and greater amounts of integrated circuitry. To accommodate the miniaturized scale of the semiconductor device, integrated circuits have emerged as an effective alternative to further reduce the physical size of a semiconductor device. A wafer level packaging (WLP) process is widely used due to its low cost and relatively simple manufacturing operations.

As the manufacturing of the semiconductor device in a miniaturized scale becomes more complicated, and as greater numbers of different components with different materials are involved, increased complexity of manufacturing the semiconductor device and the interaction of the chip package may cause deficiencies such as development of cracks due to mismatch of coefficients of thermal expansion (CTE) and bonding stress. As such, there is a continuous need to modify a structure of the semiconductor devices and improve the manufacturing operations of the semiconductor devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
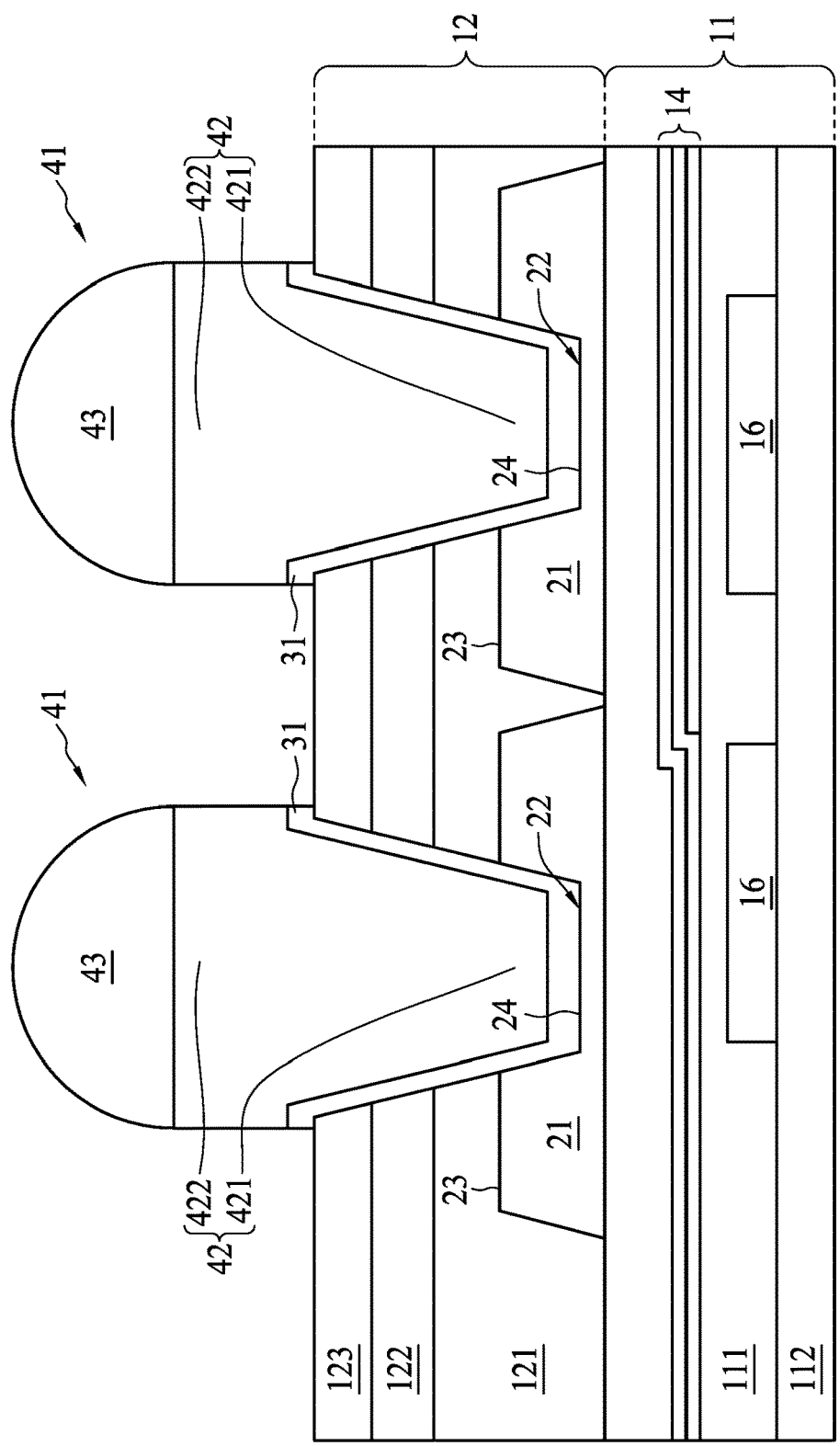
FIG. 1 is a cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Semiconductor structures and methods of manufacturing the same are provided. In particular, semiconductor structures with a portion of a conductive bump wrapped in a portion of a conductive pad are described in greater detail below. In addition, methods of forming semiconductor structures including the portion of the conductive bump wrapped in the portion of the conductive pad are also provided below. Other features and processes may also be included. For example, testing structures may be included to aid in the verification testing of the packages or IC devices. The testing structures may include, for example, test pads formed in a redistribution layer or on a substrate that allows the testing of the packages or IC, the use of probes and/or probe cards, and the like. The verification testing may be performed on intermediate structures as well as on the final structure. Additionally, the structures and methods disclosed herein may be used in conjunction with testing methodologies that incorporate intermediate verification of known good dies to increase the yield and decrease costs.

Electronic equipment using semiconductor devices is essential for many modern applications, and various components are assembled to form a semiconductor structure. In the semiconductor structure, several circuitries are formed over a substrate, the circuitries are encapsulated by a passivation layer, and I/O terminals are routed out from the substrate through conductive pads surrounded by the passivation layer. The circuitries include electrical components (such as capacitors, transistors, etc.) and conductive lines connecting the electrical components. Such configuration of the semiconductor structure involves a variety of materials (e.g., the die, the passivation layer, the conductive pad, etc.) with different thermal properties (e.g., different CTE, etc.). The circuitries of the semiconductor structure can be connected with another semiconductor structure through several conductive bumps disposed between the semiconductor structures and electrically connected to the conductive pads. The semiconductor structures are bonded with each other by the conductive bumps.

The semiconductor structure may be subject to stress (e.g., thermal stress or mechanical stress) during the process of bonding with other semiconductor structures, during a temperature reliability test, and/or during drop/shock/bending events. The stress developed in the semiconductor structure, such as stress caused by chip package interaction (CPI), arises from differences in CTEs (CTE mismatch) between materials and from the way in which the semiconductor structures are coupled to each other. Further, after the bonding, the semiconductor structure undergoes variations in temperature upon processing such as curing, reliability testing, etc. Such variations in temperature cause stress developed in the semiconductor structure as well. Moreover, under normal use of device, shock or bending events generate stress in the semiconductor structure. A mismatch of CTEs and/or CPI can cause cracking (such as passivation layer cracking, chipping, metal-insulator-metal (MIM) cracking, and dielectric cracking) within the semiconductor structure or warpage of the semiconductor structure. Cracking may induce serious problems such as poor electrical interconnection, delamination of components, or other issues. Therefore, there is a need for a semiconductor structure capable of minimizing or preventing the formation and propagation of cracks.

Before addressing illustrated embodiments specifically, advantageous features and certain aspects of the exemplary embodiments are discussed generally. General aspects of embodiments described herein include a conductive bump partially embedded in a conductive pad designed to alleviate passivation layer cracks, film delamination, bump-induced damage, or other defects arising in the semiconductor structure.

FIG. 1 is a cross-sectional view illustrating a semiconductor structure according to aspects of the present disclosure in some embodiments. Referring to FIG. 1, a first semiconductor structure 100 includes a substrate 11, a conductive pad 21, a passivation 12, a recess 22, a bump pad 31, and a conductive bump 41. In some embodiments, the conductive pad 21 is configured as an input/output (I/O) terminal of the first semiconductor structure 100, and is disposed over the substrate 11. In some embodiments, the passivation 12 is disposed over the substrate 11 and partially covers the conductive pad 21. In some embodiments, the recess 22 extends through the passivation 12 and extends at least partially into the conductive pad 21. In some embodiments, the bump pad 31 is disposed over the passivation 12 and within the recess 22, and the conductive pad 21 surrounds a portion of the conductive bump 41 and a portion of the bump pad 31. In some embodiments, the conductive bump 41 is disposed over the bump pad 31.

In some embodiments, the first semiconductor structure 100 is a part of a die or a package. In some embodiments, the first semiconductor structure 100 is configured to connect with another semiconductor structure such as a printed circuit board (PCB) for chip package interaction (CPI). In some embodiments, the first semiconductor structure 100 is a fan in (FI) structure.

In some embodiments, the substrate 11 includes semiconductive materials such as silicon or other suitable materials. In some embodiments, the substrate 11 is a silicon substrate or silicon wafer. In some embodiments, the substrate 11 includes several circuitries disposed over or in the substrate 11. In some embodiments, the circuitries include several electrical components and several conductive lines connecting the electrical components. In some embodiments, the substrate 11 includes MIM components such as a MIM capacitor 14. In some embodiments, a dielectric material 111 such as plasma enhanced oxide (PEOX), undoped silicate glass (USG), etc. is disposed over or around the MIM capacitor 14. In some embodiments, each of the conductive pads 21 is electrically coupled to a corresponding conductive trace 16. In some embodiments, the conductive trace 16 is configured to electrically couple with a die or a conductive structure, but the disclosure is not limited thereto. In some embodiments, the conductive trace 16 is formed on an inter-metal dielectric (IMD) 112.

In some embodiments, the first semiconductor structure 100 includes at least two conductive pads 21 disposed over the substrate 11. The conductive pads 21 are respectively configured as an input/output (I/O) terminal of the first semiconductor structure 100, and each of the conductive pads 21 has a recess 22 extending at least partially therethrough. In some embodiments, each of the conductive pads 21 is electrically coupled to a corresponding conductive trace 16 disposed in the substrate 11.

In some embodiments, the conductive pad 21 is configured to reduce stress and minimize, prevent, and/or stop propagation of a crack that may start from the top of the first semiconductor structure 100 where a PCB may be coupled to the first semiconductor structure 100. In some embodiments, the conductive pad 21 can increase a resistance to a stress or force over or within the semiconductor structure 100. In some embodiments, the conductive pad 21 can reduce warpage of the first semiconductor structure 100 caused by CTE mismatch between the substrate 11, the conductive pad 21, the passivation 12, the bump pad 31, and the conductive bump 41. In some embodiments, the conductive pad 21 has a thickness substantially greater than 25000 Å along a first direction Z perpendicular to the surface of the substrate 11. In some embodiments, the thickness of the conductive pad 21 is about 25000 Å to about 45000 Å. As such, development of a crack can be minimized or prevented, and reliability of the first semiconductor structure 100 is improved. In some embodiments, a cross section of the conductive pad 21 along a second direction X perpendicular to the first direction Z is in a circular, quadrilateral or polygonal shape.

In some embodiments, the conductive pad 21 includes conductive material such as gold (Au), silver (Ag), copper (Cu), nickel (Ni), tungsten (W), aluminum (Al), tin (Sn), tantalum (Ta), tantalum nitride (TaN), aluminum copper (AlCu) and/or alloys thereof.

FIG. 1 illustrates only two conductive pads 21 for clarity and simplicity, but such example is intended to be illustrative only, and is not intended to be limiting to the embodiments. A person ordinarily skilled in the art would readily understand that any suitable number of the conductive pads 21 may alternatively be utilized, and all such combinations are fully intended to be included within the scope of the embodiments. Additionally, while the conductive pads 21 are illustrated as having similar features, this is intended to be illustrative and is not intended to limit the embodiments, as the conductive pads 21 may have similar structures or different structures in order to meet the desired functional capabilities.

In some embodiments, the recess 22 extends along the direction Z. In some embodiments, each recess 22 extends through the passivation 12 and extends at least partially through the conductive pad 21. The recess 22 is configured to receive the bump pad 31 and the conductive bump 41. In some embodiments, the maximum width of the conductive pad 21 along the second direction X is more than 2 times the maximum width of the recess 22 along the second direction X, but the disclosure is not limited thereto. FIG. 1 illustrates only two recesses 22 extending through the passivation 12 and extending at least partially into the corresponding conductive pads 21 for clarity and simplicity; however, a person ordinarily skilled in the art would readily understand that one or more recesses 22 can be present.

In some embodiments, the bump pad 31 is surrounded by the passivation 12 and conductive pad 21. In some embodiments, a portion of the bump pad 31 is disposed within the conductive pad 21. In some embodiments, the bump pad 31 is electrically connected to circuitry in the substrate 11, such as a corresponding conductive trace 16 or any conductive structure. In some embodiments, a portion of the bump pad 31 is disposed conformal to the recess 22. In some embodiments, the bump pad 31 extends within the passivation 12.

In some embodiments, the bump pad 31 is in contact with the conductive pad 21. In some embodiments, an interface 24 between the conductive pad 21 and the bump pad 31 is disposed within the conductive pad 21. In some embodiments, the interface 24 is disposed under a top surface 23 of the conductive pad 21. In some embodiments, the interface 24 is conformal to the recess 22. In other words, the bump pad 31 is protruded into the conductive pad 21.

In some embodiments, the bump pad 31 is configured to receive a conductive bump 41. In some embodiments, the bump pad 31 is configured to receive a conductive structure. In some embodiments, the bump pad 31 is an under bump metallization (UBM) pad. In some embodiments, the bump pad 31 includes gold (Au), silver (Ag), copper (Cu), nickel (Ni), titanium (Ti), tungsten (W), aluminum (Al), palladium (Pd) and/or alloys thereof. FIG. 1 illustrates only two bump pads 31 over the conductive pads 21 for clarity and simplicity, however, a person ordinarily skilled in the art would readily understand that one or more bump pads 31 can be present.

Still referring to FIG. 1, in some embodiments, the passivation 12 is disposed over the substrate 11 and surrounding the conductive pad 21. In some embodiments, the passivation 12 covers a portion of the conductive pad 21, such that the conductive pad 21 is partially exposed. In some embodiments, the passivation 12 surrounds the conductive pad 21. In some embodiments, a portion of a top surface 23 of the conductive pad 21 is exposed through the passivation 12. In some embodiments, the passivation 12 is configured for providing an electrical insulation and a moisture protection for the substrate 11, so that the substrate 11 is isolated from the ambient environment. In some embodiments, the passivation 12 includes dielectric material such as polyimide (PI), benzocyclobutene (BCB), undoped silicate glass (USG), fluorinated silicate glass (FSG), spin-on glass (SOG), silicon oxide (SiO), silicon oxynitride (SiON), silicon nitride (SiN), silicon carbide (SiC), or the like, low-k dielectrics such as carbon doped oxides, extremely low-k dielectrics such as porous carbon doped silicon dioxide, or combinations thereof.

In some embodiments, the passivation 12 is composed of at least two layers, such as a first passivation layer 121, a second passivation layer 122 and a third passivation layer 123 stacked over each other. In some embodiments, the first passivation layer 121 is disposed over the substrate 11 and partially covers the conductive pad 21. In some embodiments, the second passivation layer 122 is disposed over the first passivation layer 121. In some embodiments, the third passivation layer 123 serves as a buffer layer and is disposed over the second passivation layer 122. In some embodiments, the first passivation layer 121 includes dielectric material such as USG, FSG or the like. In some embodiments, the second passivation layer 122 includes dielectric material such as silicon nitride or the like. In some embodiments, the third passivation layer 123 includes polymer, polyimide (PI) or the like. In some embodiments, a thickness of the first passivation layer 121 is between 10000 Å and 20000 Å. In some embodiments, a thickness of the second passivation layer 122 is between about 5000 Å and 10000 Å. In some embodiments, a thickness of the third passivation layer 123 is between about 5 μm and 10 μm. In some embodiments, the recess 22 extends through the first passivation layer 121, the second passivation layer 122 and the third passivation layer 123.

In some embodiments, the conductive bump 41 is disposed over the bump pad 31. The bump pad 31 and the conductive bump 41 extend at least partially into the conductive pad 21, and such configuration allows the stress arising from the mismatch of CTE and/or from CPI of the first semiconductor structure 100 to be effectively reduced. In some embodiments, a portion of the conductive bump 41 and a portion of the bump pad 31 are exposed through the passivation 12. In some embodiments, the conductive bump 41 is electrically connected to circuitry in the substrate 11 through the bump pad 31 and the conductive pad 21. FIG. 1 illustrates only two conductive bumps 41 over the bump pads 31 for clarity and simplicity; however, a person ordinarily skilled in the art would readily understand that one or more conductive bumps 41 can be present.

In some embodiments, the conductive bump 41 may be a contact bump, solder bump, a ball grid array (BGA) ball, a controlled collapse chip connection (C4) bump, microbump, a metal pillar, or the like. In some embodiments, the conductive bump 41 includes conductive material such as tin (Sn), silver (Ag), lead-free tin (lead-free Sn), copper (Cu), or combinations thereof. In some embodiments, the conductive bump 41 includes a conductive pillar 42 disposed over the bump pad 31 and a soldering member 43 disposed over the conductive pillar 42. In some embodiments, the conductive pillar 42 is electrically connected with the bump pad 31. In some embodiments, the conductive pillar 42 protrudes from the bump pad 31. In some embodiments, the conductive pillar 42 is configured to electrically connect to a circuitry or a conductive structure of the first semiconductor structure 100. In some embodiments, the conductive bump 41 is in a spherical, hemispherical or cylindrical shape. In some embodiments, the first semiconductor structure 100 further includes an external structure electrically connected to the conductive pads 21 through the conductive bump 41.

In some embodiments, a first end portion 421 of the conductive pillar 42 is surrounded by the conductive pad 21 and the bump pad 31, and a second end portion 422 of the conductive pillar 42 opposite to the first end portion 421 is coated with the soldering member 43.

In some embodiments, the soldering member 43 is attached to a top surface of the conductive pillar 42. In some embodiments, the soldering member 43 has a low eutectic point and good adhesion with a conductive structure such as a bond pad or the like. In some embodiments, the soldering member 43 is a solder paste mixture of metallic powders and flux. In some embodiments, the soldering member 43 includes tin (Sn), lead (Pb), silver (Ag), copper (CU), nickel (Ni) or any combinations thereof. In some embodiments, the soldering member 43 is in a dome or hemispherical shape.

Figure 2:
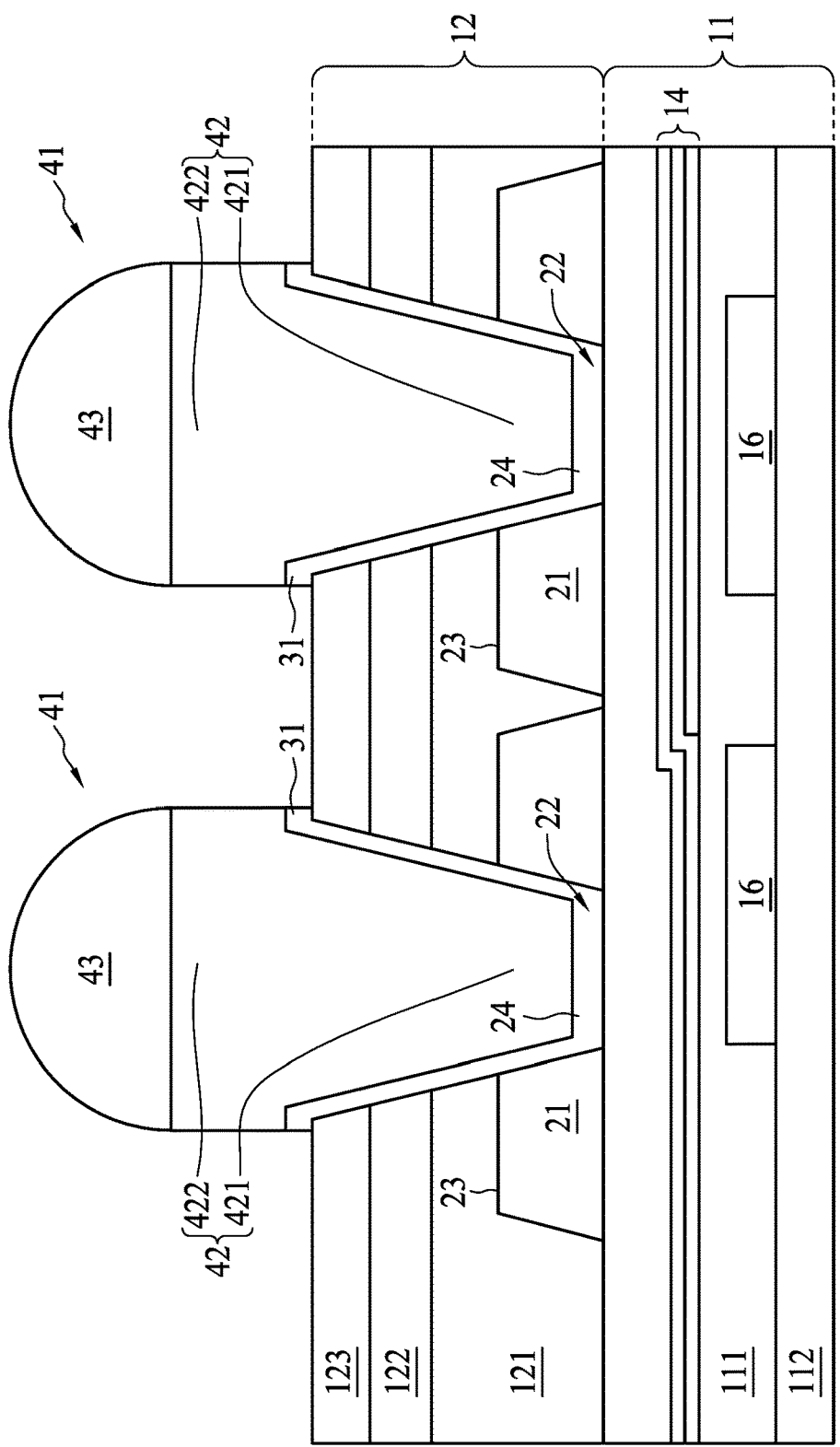
FIG. 2 is a cross-sectional view of a semiconductor structure in accordance with some embodiments of the present disclosure.

FIG. 2 is a cross-sectional view of a semiconductor structure according to aspects of the present disclosure in some embodiments. In some embodiments, a second semiconductor structure 200 includes a substrate 11, a passivation 12, a conductive pad 21 and a conductive bump 41, which are in configurations similar to those described above or shown in FIG. 1.

In some embodiments, the recess 22 of the second semiconductor structure 200 extends through the passivation 12 and completely through the conductive pad 21. In some embodiments, the bump pad 31 extends through the passivation 12. In other words, a portion of the conductive pad 21 under the bump pad 31 is absent.

Figure 3:
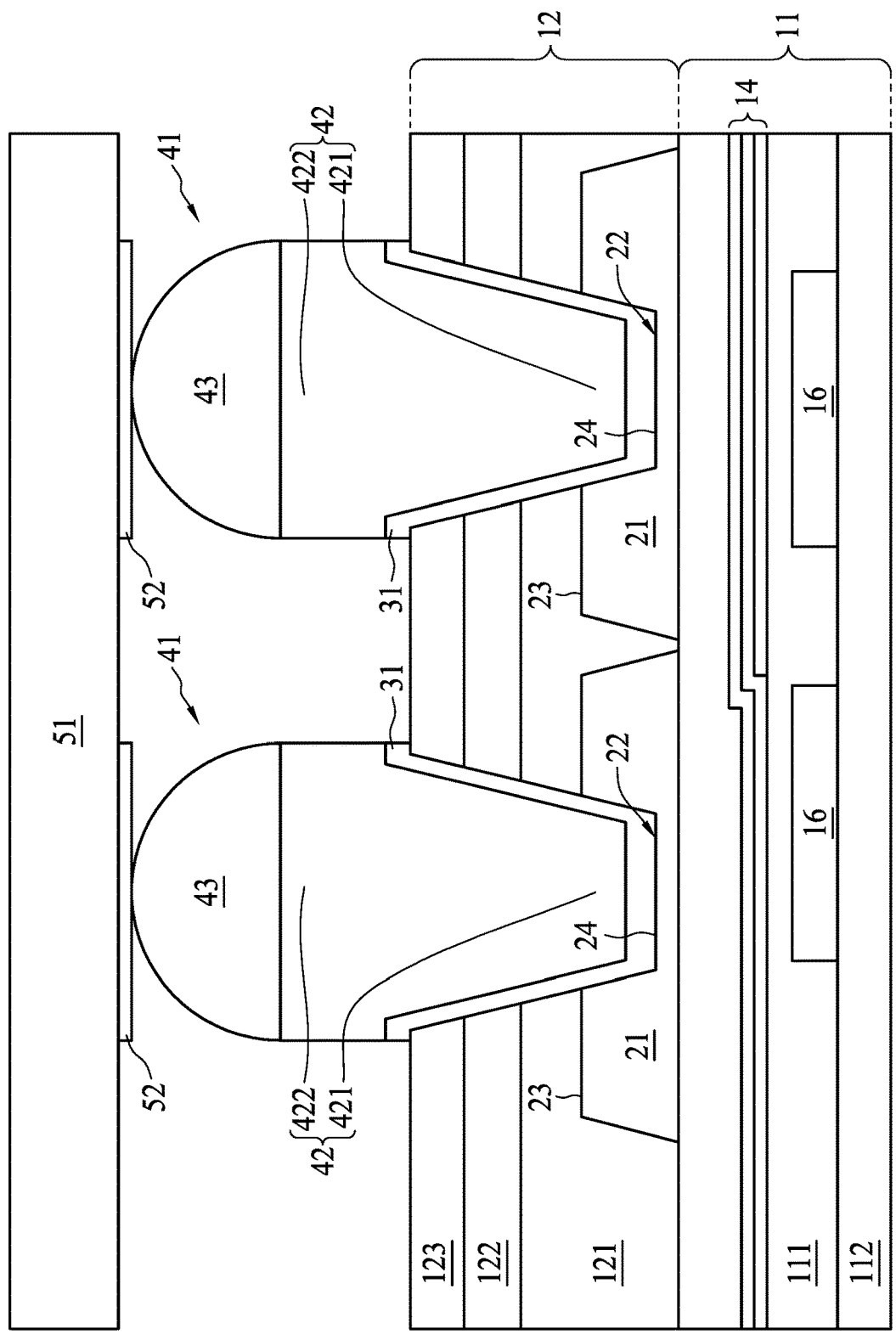
FIG. 3 is a cross-sectional view of a semiconductor structure in accordance with some embodiments of the present disclosure.

FIG. 3 is a schematic cross-sectional view of a third semiconductor structure 300 in accordance with various embodiments of the present disclosure. In some embodiments, the third semiconductor structure 300 includes the first semiconductor structure 100 of FIG. 1 as described above. In some embodiments, the third semiconductor structure 300 includes a second substrate 51 and a second conductive pad 52 disposed over the second substrate 51.

In some embodiments, the second substrate 51 includes a circuitry or device disposed over the second substrate 51. In some embodiments, the second substrate 51 is a PCB. In some embodiments, the first semiconductor structure 100 is disposed over the second substrate 51. In some embodiments, the conductive bump 41 of the third semiconductor structure 300 is mounted over the second substrate 51. In some embodiments, the soldering member 43 is bonded with the second conductive pad 52. In some embodiments, a circuitry of the first semiconductor structure 100 is electrically connected with a circuitry of the second substrate 51 by the conductive bump 41 and the second conductive pad 52.

Figure 4:
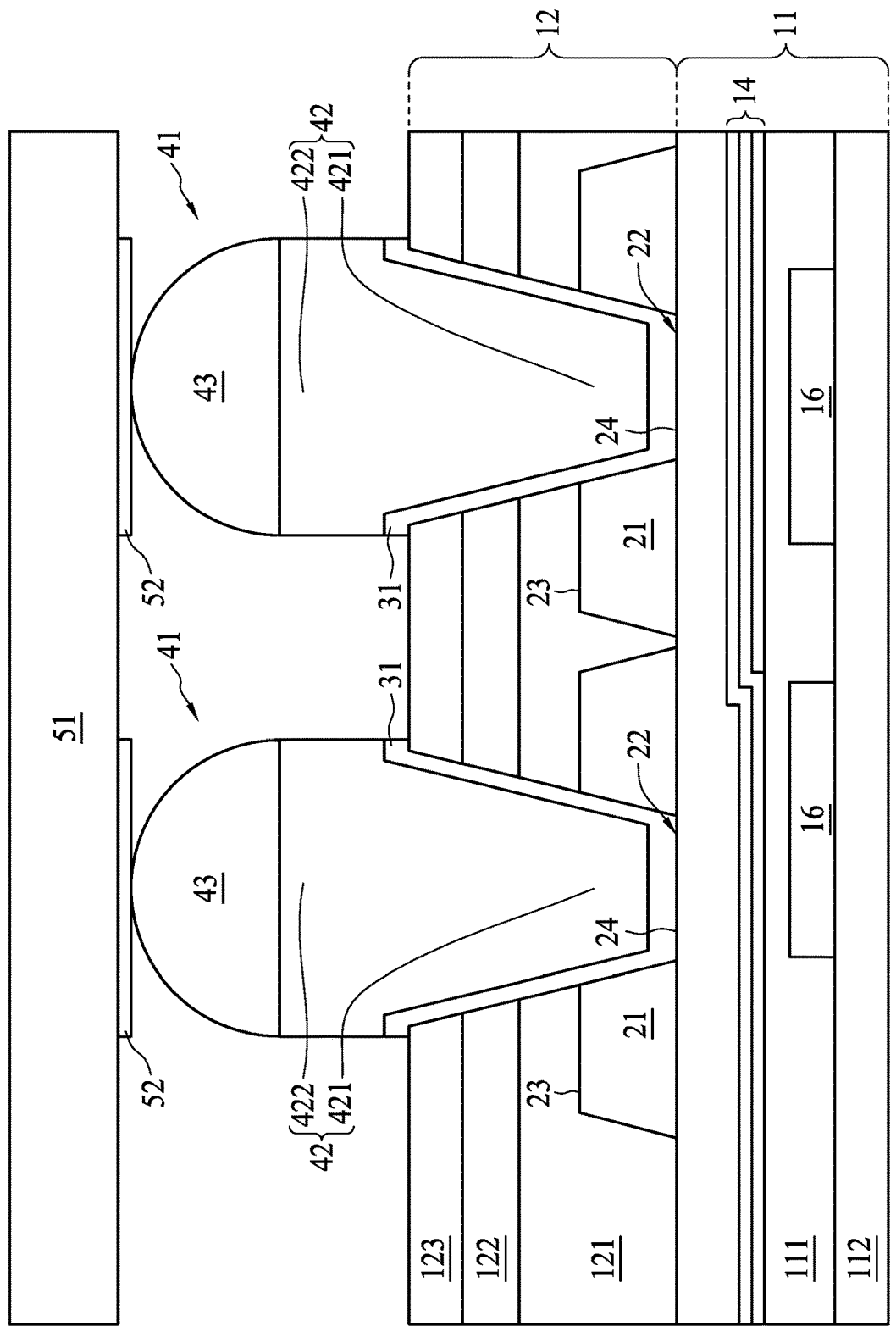
FIG. 4 is a cross-sectional view of a semiconductor structure in accordance with some embodiments of the present disclosure.

FIG. 4 is a schematic cross-sectional view of a fourth semiconductor structure 400 in accordance with various embodiments of the present disclosure. In some embodiments, the second semiconductor structure 200 is bonded with the second substrate 51. In some embodiments, the second conductive pad 52 of the second substrate 51 is bonded with the conductive bump 41 of the second semiconductor structure 200. In some embodiments, the second conductive pad 52 is bonded with the soldering member 43 of the second semiconductor structure 200.

Figure 5:
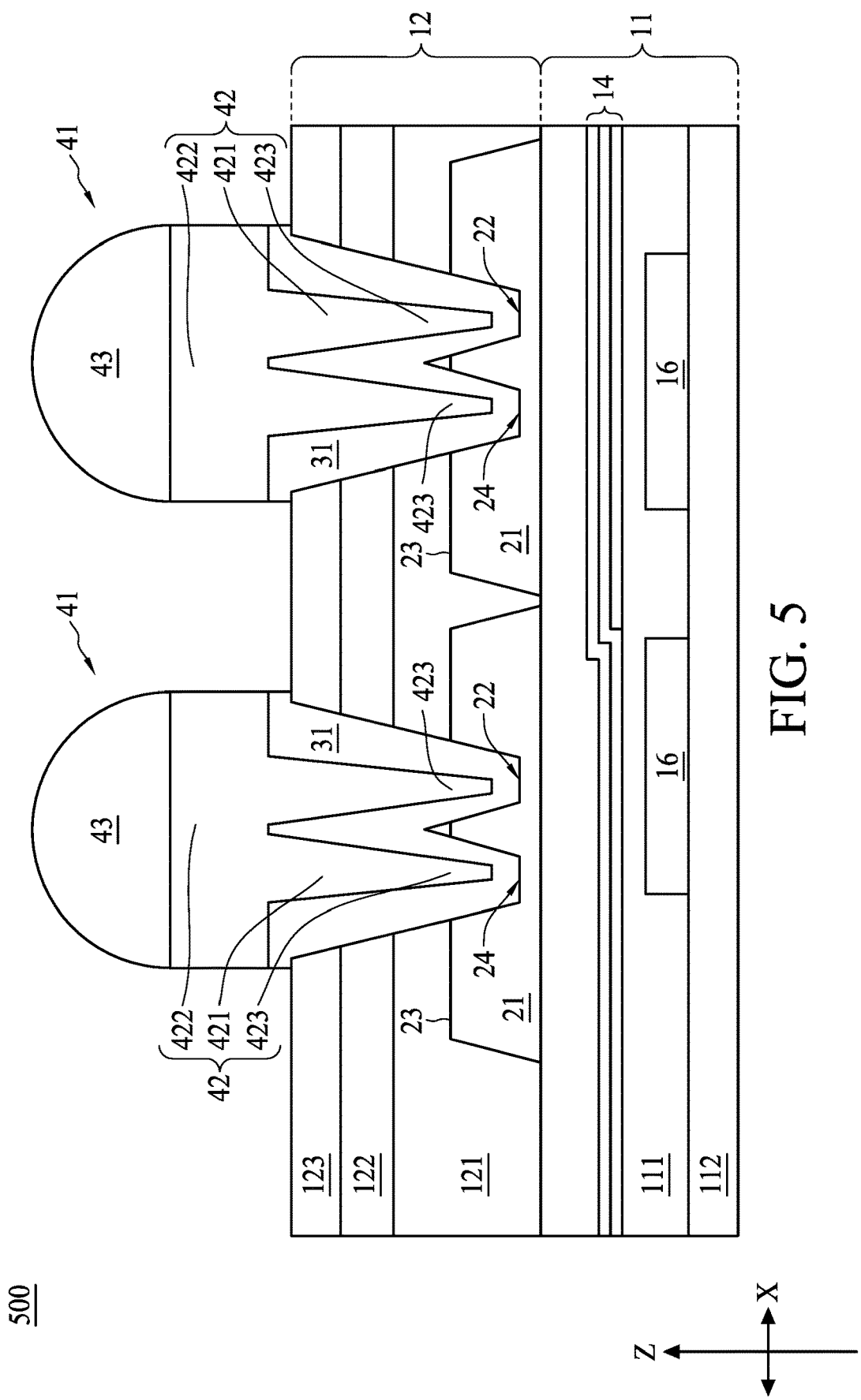
FIG. 5 is a cross-sectional view of a semiconductor structure in accordance with some embodiments of the present disclosure.

FIG. 5 is a schematic cross-sectional view of a fifth semiconductor structure 500 in accordance with various embodiments of the present disclosure. In some embodiments, the fifth semiconductor structure 500 includes a substrate 11 and a passivation 12, which are in configurations similar to those described above or shown in FIG. 1.

In some embodiments, the fifth semiconductor structure 500 further includes a plurality of recesses 22 extending through the passivation 12 and extending at least partially into each of the conductive pads 21. For example, as shown in FIG. 5, two recesses 22 extend into one conductive pad 21. FIG. 5 illustrates only two recesses 22 extending into one conductive pad 21 for clarity and simplicity; however, a person ordinarily skilled in the art would readily understand that one or more recesses 22 can be present and extend into one conductive pad 21.

In some embodiments, the bump pad 31 is disposed over the passivation 12 and within the plurality of recesses 22. In some embodiments, the conductive bump 41 is disposed over the bump pad 31. In some embodiments, the first end portion 421 of the conductive pillar 42 includes a plurality of posts 423 respectively extending into the plurality of recesses 22. As such, the conductive pillars 421 may more evenly distribute the stress and reduce the stress concentration upon CPI.

In some embodiments, at least a portion of the bump pad 31 is disposed conformal to the plurality of recesses 22. In some embodiments, at least a portion of the bump pad 31 is disposed between two of the plurality of conductive pillars 421. In some embodiments, at least a portion of the conductive pad 21 is disposed between two of the plurality of conductive pillars 421. In some embodiments, at least a portion of the passivation 12 is disposed between two of the plurality of recesses 22. In some embodiments, at least a portion of the first passivation layer 121 is disposed between two of the plurality of recesses 22. In some embodiments, at least a portion of the first passivation layer 121 and at least a portion of the second passivation layer 122 are disposed between two of the plurality of recesses 22. In some embodiments, at least a portion of the third passivation layer 123 is disposed between two of the plurality of recesses 22.

Figure 6:
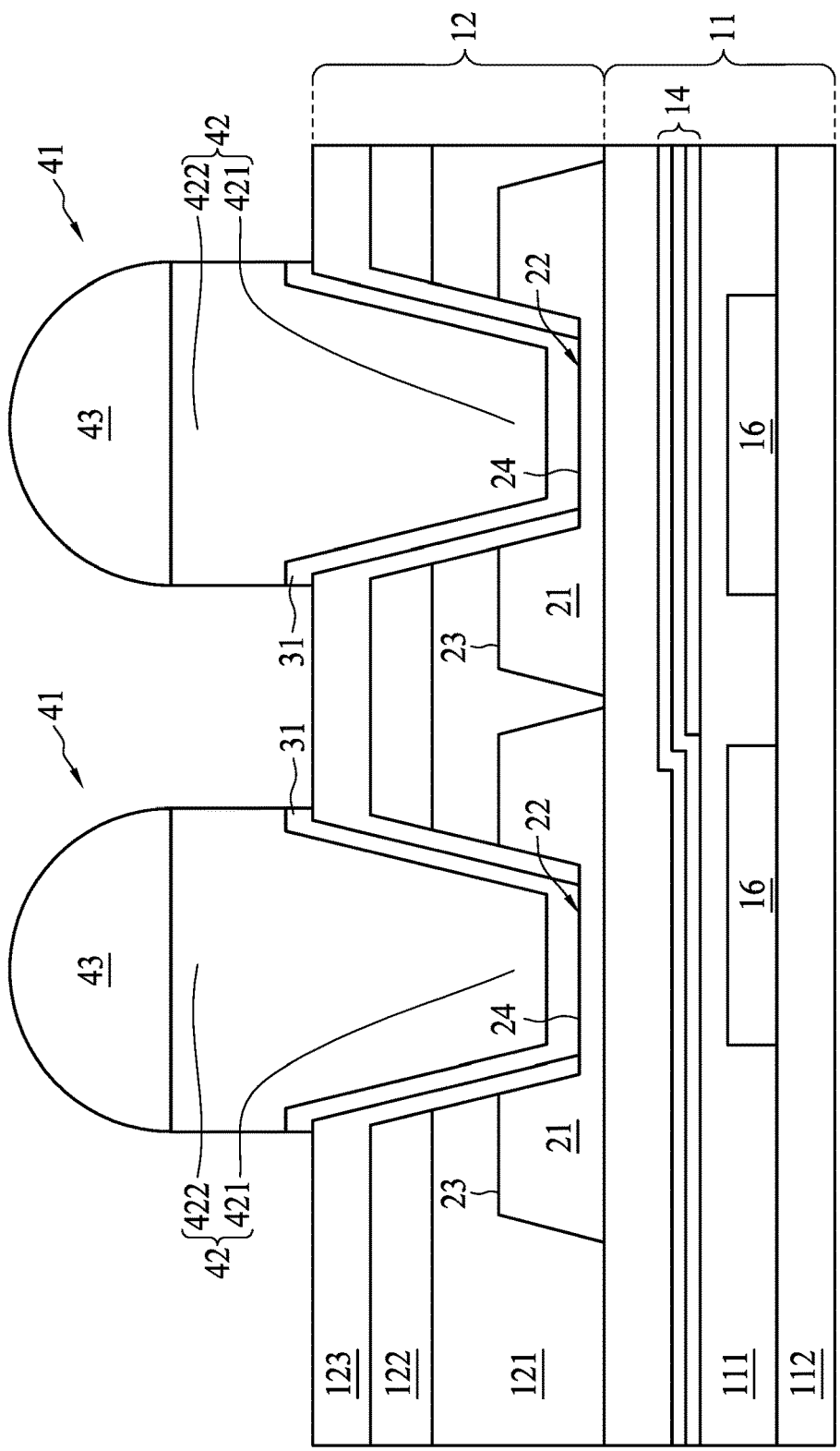
FIG. 6 is a cross-sectional view of a semiconductor structure in accordance with some embodiments of the present disclosure.

FIG. 6 is a schematic cross-sectional view of a sixth semiconductor structure 600 in accordance with various embodiments of the present disclosure. In some embodiments, the sixth semiconductor structure 600 includes a substrate 11, a conductive pad 21, a recess 22 and a conductive bump 41, which are in configurations similar to those described above or shown in FIG. 1.

In some embodiments, the bump pad 31 is in contact with the conductive pad 21 and the third passivation layer 123. In some embodiments, a portion of the third passivation layer 123 is in contact with the conductive pad 21 and disposed within the recess 22. In some embodiments, the third passivation layer 123 of the sixth semiconductor structure 600 surrounds the bump pad 31. In some embodiments, at least a portion of the third passivation layer 123 is disposed under the top surface 23 of the conductive pad 21. In some embodiments, the interface 24 between the conductive pad 21 and the bump pad 31 is disposed within the conductive pad 21 and the third passivation layer 123.

Figure 7:
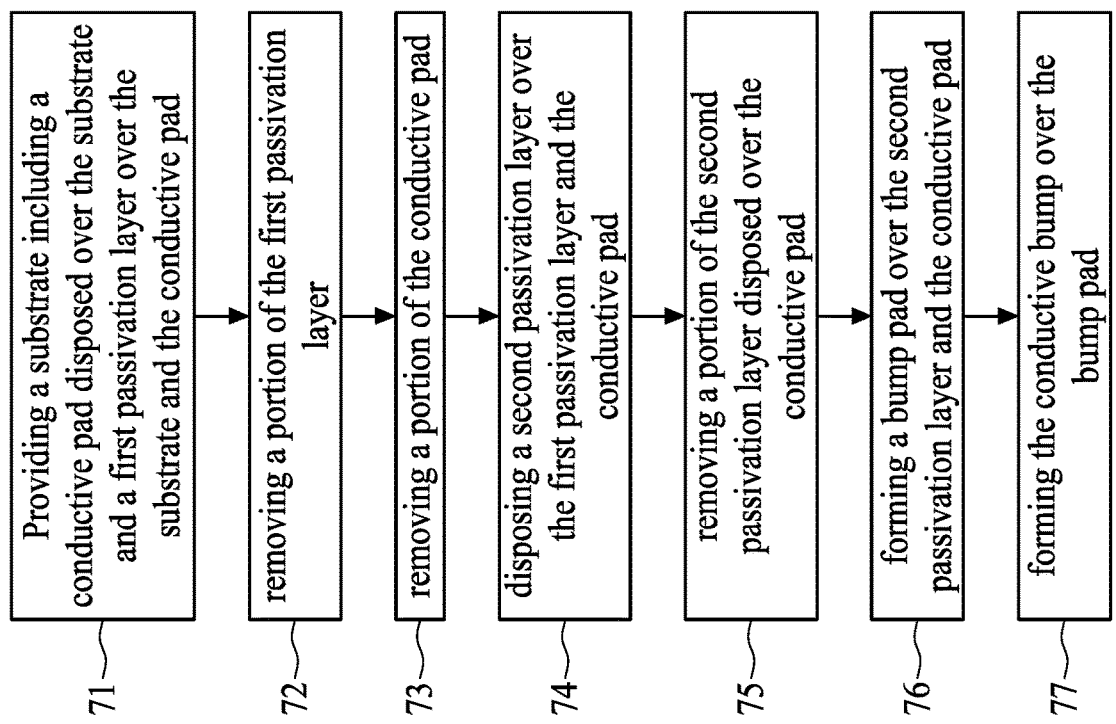
FIG. 7 is a flowchart representing a method of manufacturing a semiconductor structure according to aspects of the present disclosure in one or more embodiments.

In the present disclosure, a method of manufacturing a semiconductor structure is also disclosed. In some embodiments, a semiconductor structure is manufactured by the method. The method includes a number of operations and the description and illustration are not deemed as a limitation as the sequence of the operations. FIG. 7 is an embodiment of the method of manufacturing the semiconductor structure. The method includes operations 71, 72, 73, 74, 75, 76 and 77.

FIGS. 8 to 27 are cross-sectional views illustrating exemplary operations for manufacturing a semiconductor structure of the present disclosure. In some embodiments, the operations of FIGS. 8 to 27 may be used to provide or manufacture the semiconductor structure illustrated in any of FIGS. 1-4.

Figure 8:
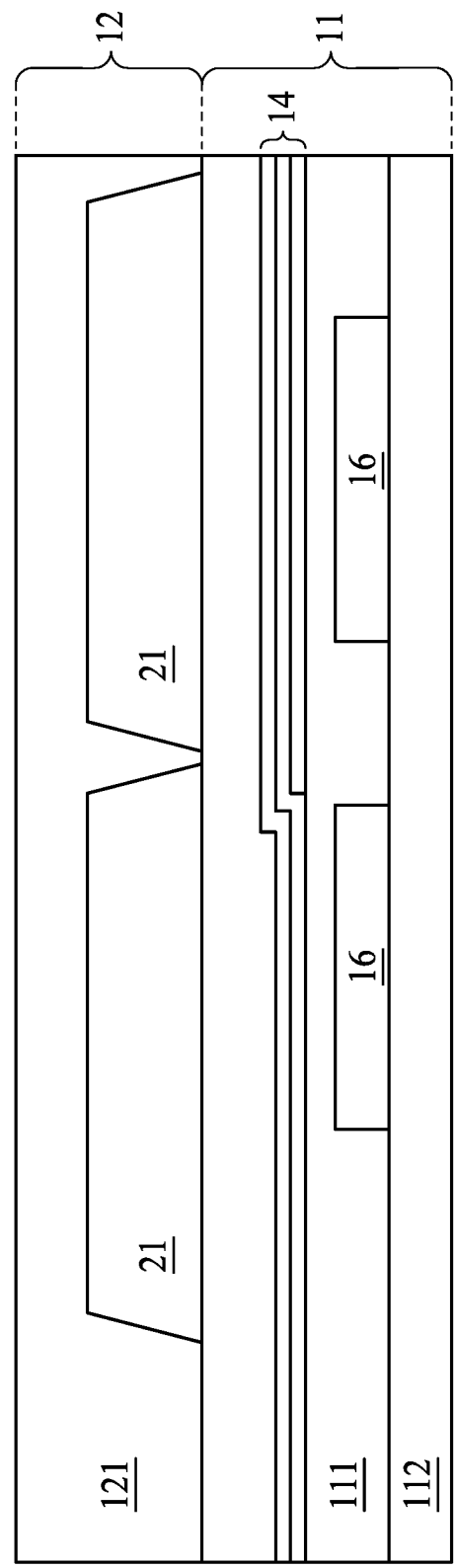
FIGS. 8 to 27 are cross-sectional views of a semiconductor structure manufactured at various stages in accordance with some embodiments of the present disclosure.

In operation 71, a substrate 11 including a conductive pad 21 and a first passivation layer 121 is provided or received as shown in FIG. 8. The first passivation layer 121 covers a portion of the substrate 11 and the conductive pads 21. In some embodiments, the substrate 11 includes an inter-metal dielectric (IMD) 112, a conductive trace 16 disposed in or over the IMD 112, a dielectric material 111 disposed over the IMD 112 and the conductive trace 16, and a MIM capacitor 14 embedded in the dielectric material 111. In some embodiments, the first passivation layer 121 includes dielectric material such as USG, FSG or the like. In some embodiments, the first passivation layer 121 is part of a passivation 12 (shown in FIG. 11).

Figure 14:
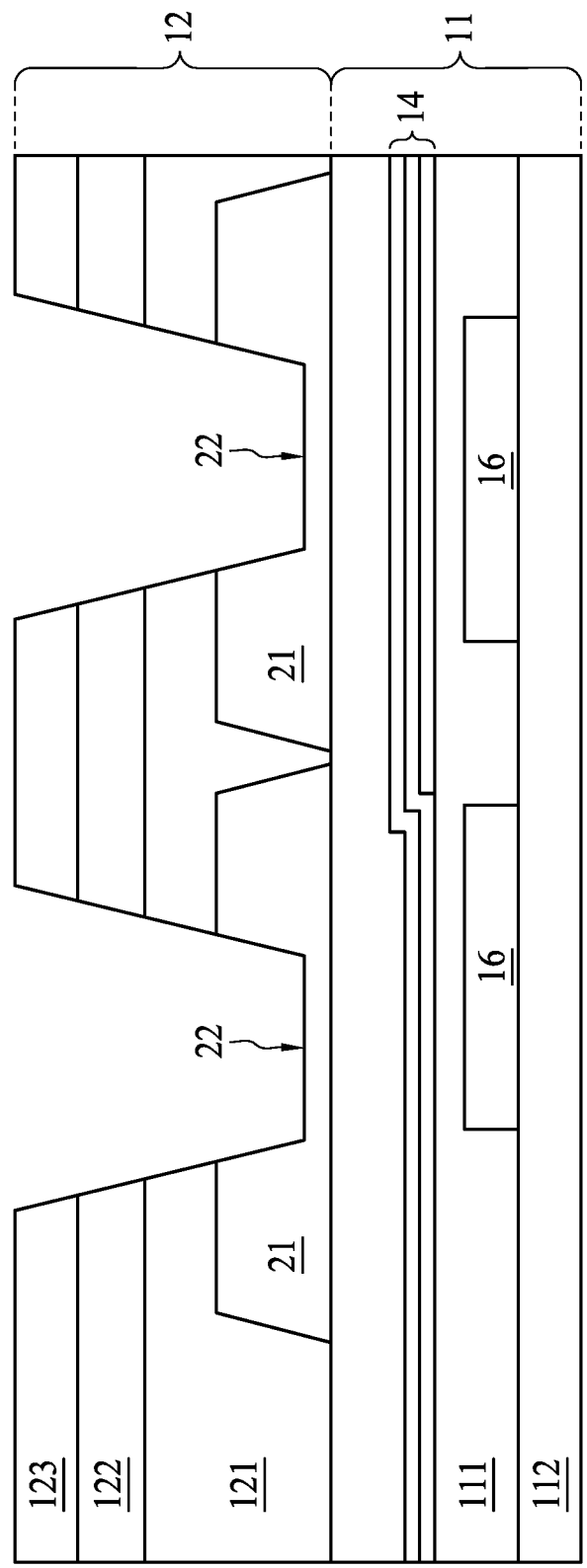
Figure 20:
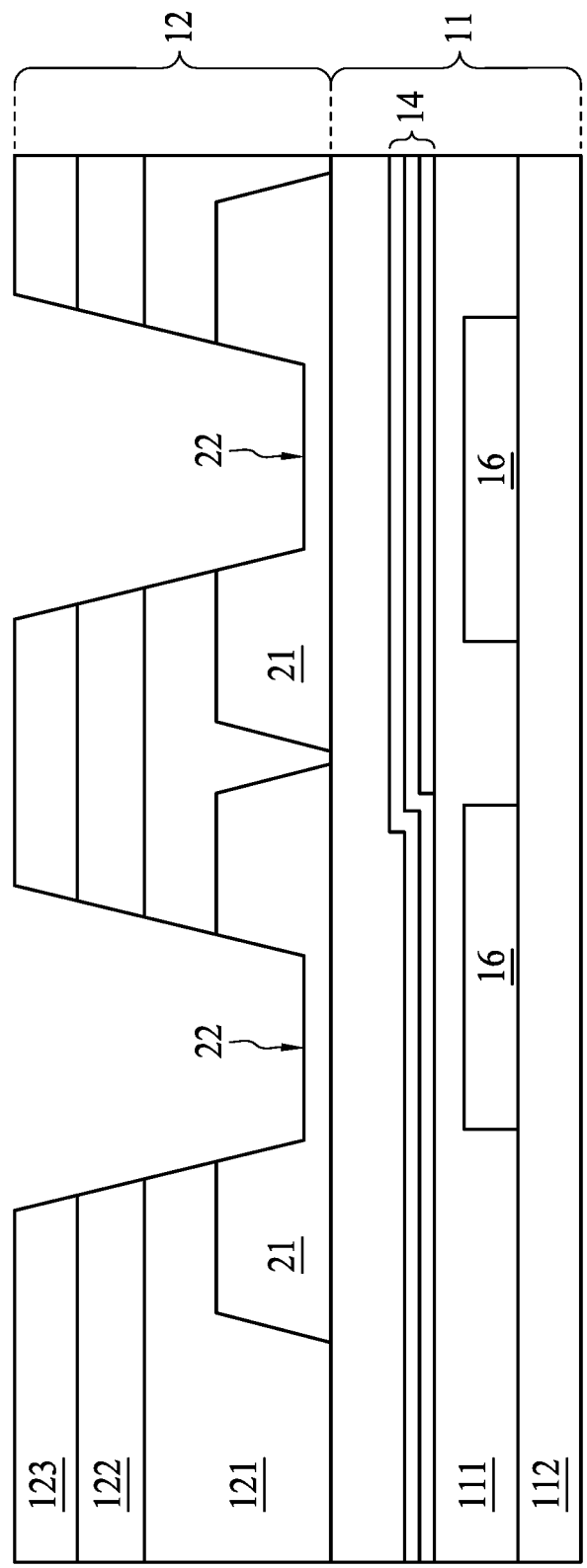

In operations 72 to 75, a recess 22 extending through the passivation 12 and into the conductive pad 21 is formed as shown in FIG. 14 or 20. The recess 22 is configured to receive a subsequently-formed bump pad 31. In some embodiments, the passivation 12 includes the first passivation layer 121, the second passivation layer 122 and the third passivation layer 123. In some embodiments, the recess 22 extends through the first passivation layer 121, the second passivation layer 122 and the third passivation layer 123, and extends at least partially into the conductive pad 21 as shown in FIG. 14. The recess 22 is formed after the removal of the portion of the first passivation layer 121, the removal of the portion of the second passivation layer 122, the removal of the portion of the third passivation layer 123 and the removal of the portion of the conductive pad 21.

Figure 9:
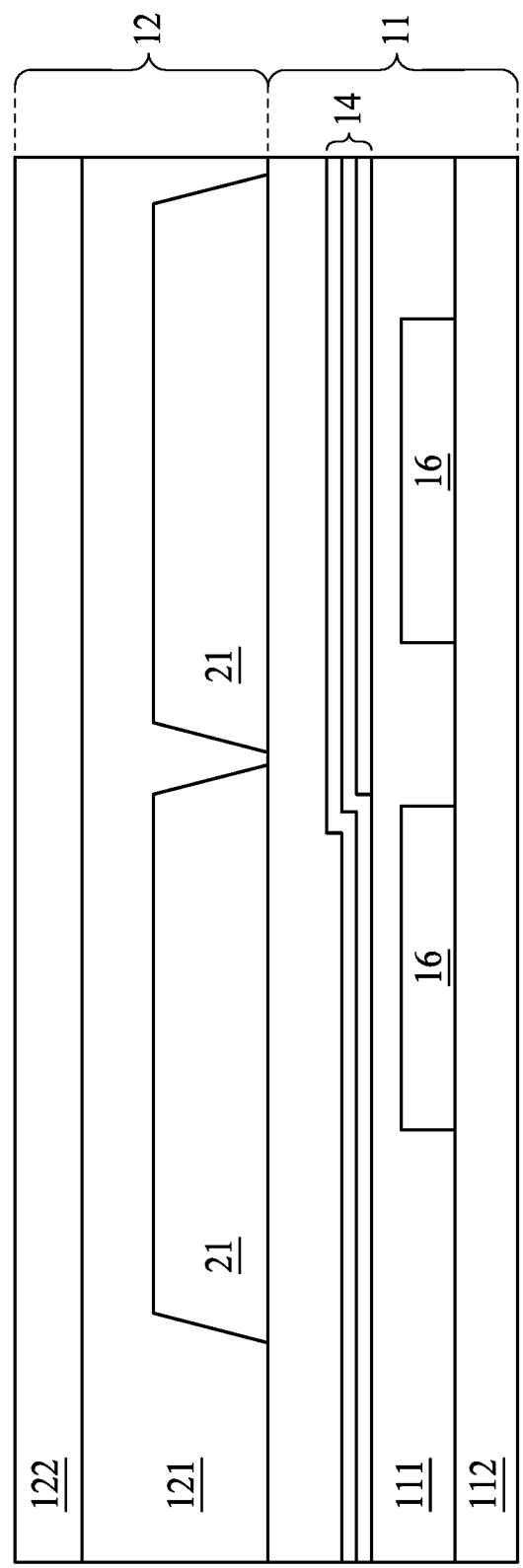
Figure 10:
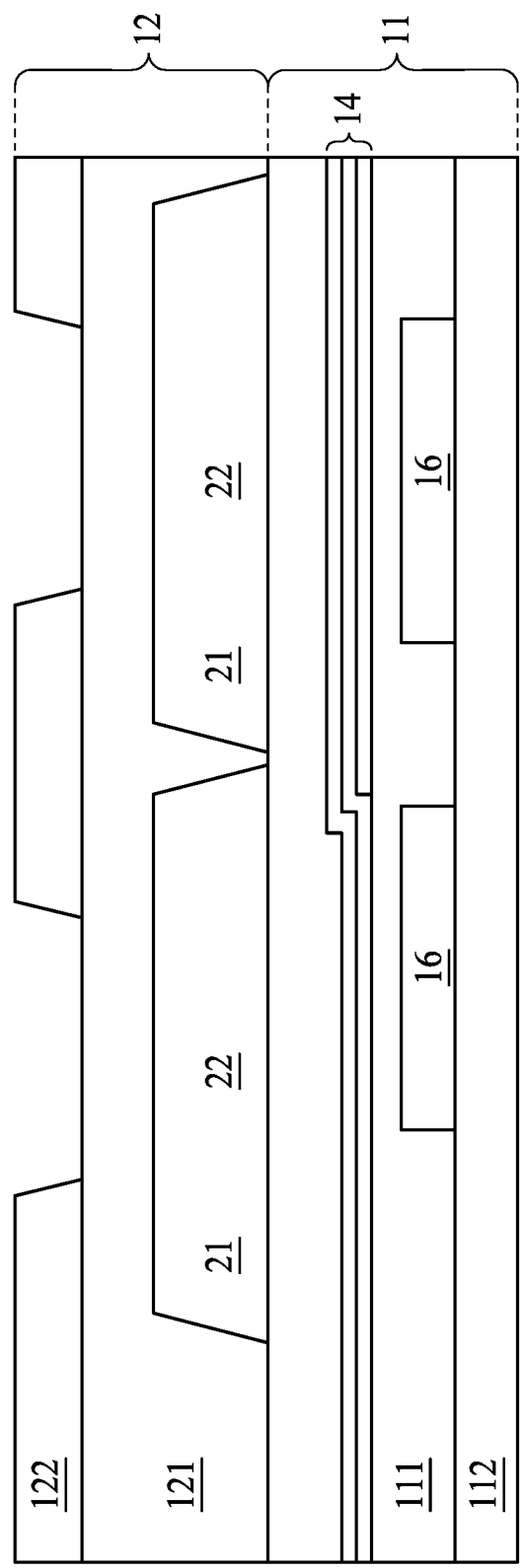
Figure 11:
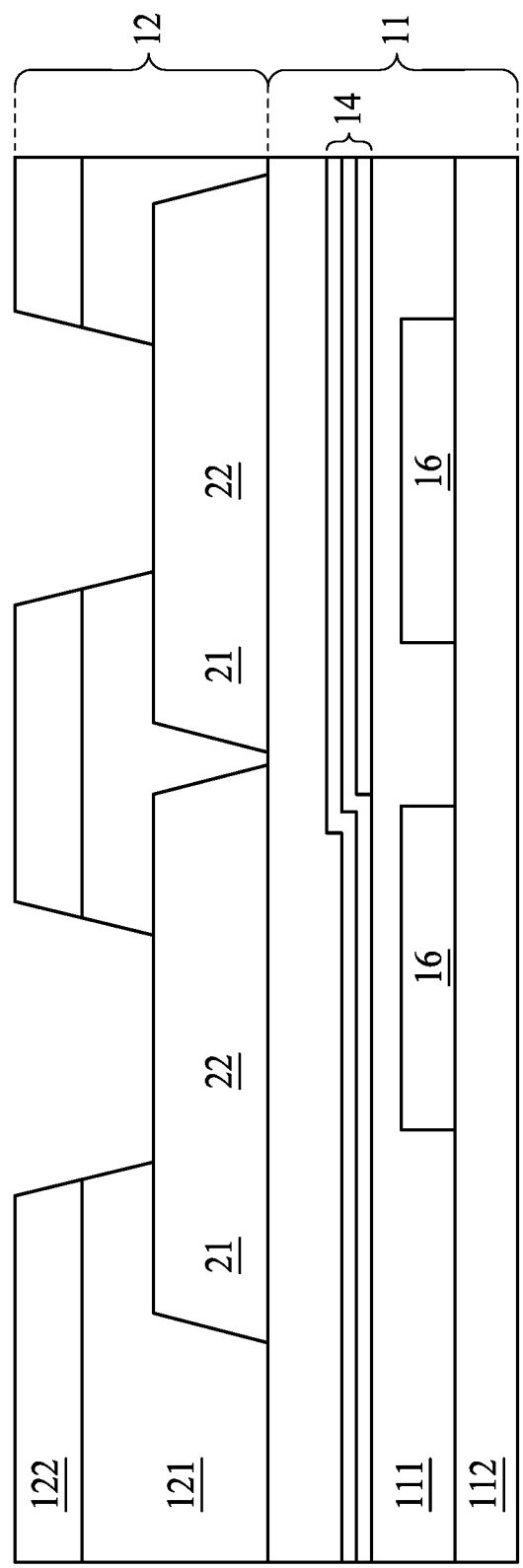
Figure 12:
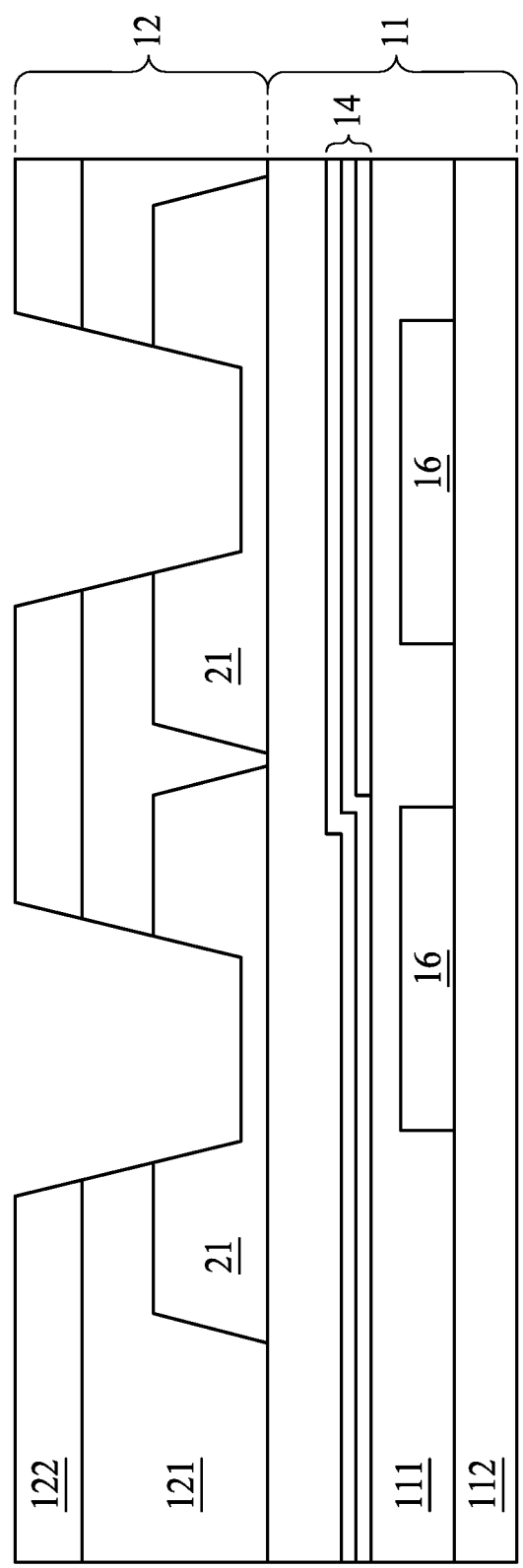
Figure 13:
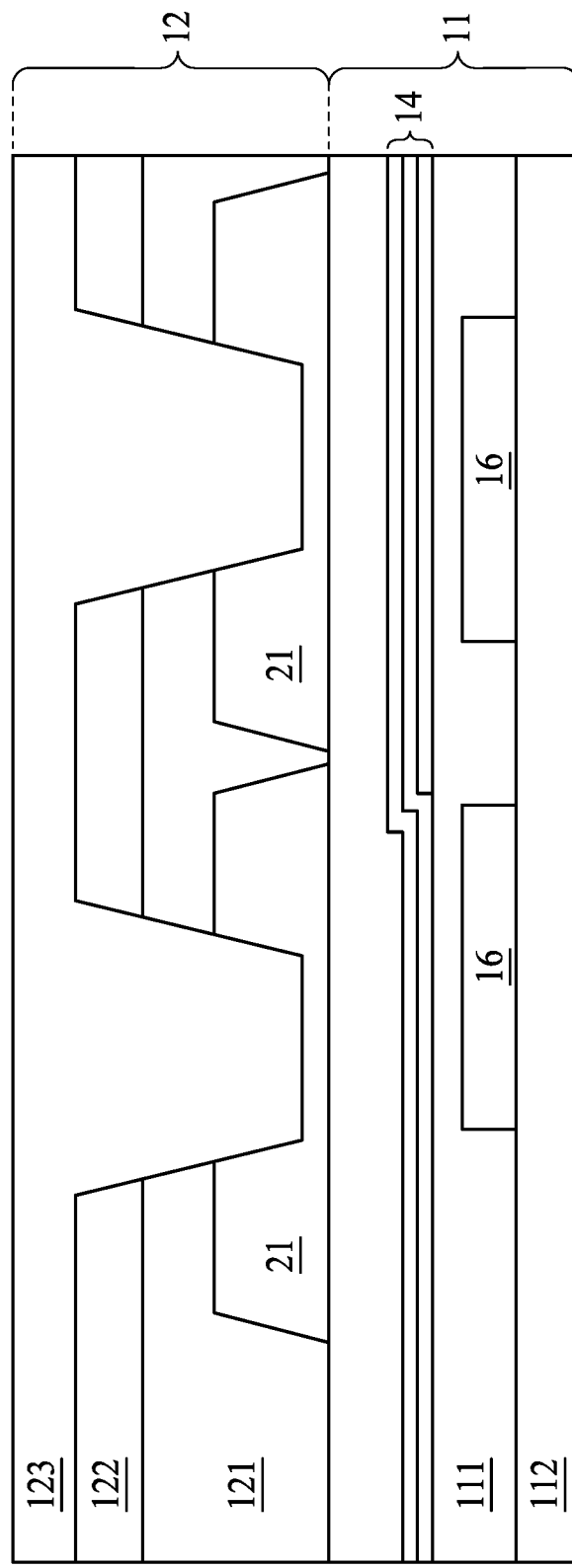

In some embodiments as shown in FIGS. 9 to 14, the formation of the recess 22 (the operations 72 to 75) includes disposing a second passivation layer 122 over the first passivation layer 121 as shown in FIG. 9, removing a portion of the second passivation layer 122 as shown in FIG. 10, removing a portion of the first passivation layer 121 as shown in FIG. 11 (the operation 72), and removing a portion of the conductive pad 21 as shown in FIG. 12 (the operation 73), disposing a third passivation layer 123 as shown in FIG. 13 (the operation 74) and removing a portion of the third passivation layer 123 as shown in FIG. 14 (the operation 75).

In some embodiments, the second passivation layer 122 includes a dielectric material such as silicon nitride or the like. The second passivation layer 122 may be individually formed using an electro-chemical plating process, an electroless plating process, PVD, ALD, the like, or a combination thereof.

In some embodiments, a photoresist material (not shown) is formed over the second passivation layer 122. In some embodiments, the photoresist material is disposed by spin coating, sputtering or any other suitable operation. The photoresist material is subsequently irradiated (exposed) and developed to remove a portion of the photoresist material. Subsequently, the exposed portions of the second passivation layer 122 are removed using, for example, a suitable etching process to form the recess 22.

In some embodiments as shown in FIGS. 10 and 11, the removal of the portion of the first passivation layer 121 and the removal of the portion of the second passivation layer 122 are performed separately. In other words, the portion of the first passivation layer 121 is removed, and then the portion of the second passivation layer 122 is removed.

In some embodiments as shown in FIGS. 9 and 11, the removal of the portion of the first passivation layer 121 and the removal of the portion of the second passivation layer 122 are performed simultaneously. In other words, the first passivation layer 121 and the second passivation layer 122 are disposed, and then the portion of the first passivation layer 121 and the portion of the second passivation layer 122 are removed.

In some embodiments as shown in FIGS. 11 and 12, the removal of the portion of the conductive pad 21 and the removal of the portion of the first passivation layer 121 and the portion of the second passivation layer 122 are performed separately. In other words, the removal of the portion of the conductive pad 21 is performed after the removal of the portion of the first passivation layer 121 and the portion of the second passivation layer 122.

In some embodiments as shown in FIGS. 13 and 14, the third passivation layer 123 is disposed over the second passivation layer 122 after the removal of the portion of the first passivation layer, the removal of the portion of the second passivation layer 122 and the removal of the portion of the conductive pad 21. In some embodiments, the portion of the third passivation layer 123 is removed after the disposing of the third passivation layer 123.

In some embodiments as shown in FIG. 14, the recess 22 is formed by disposing the first passivation layer 121, the second passivation layer 122, the third passivation layer 123, and then removing the portion of the first passivation layer 121, the portion of the second passivation layer 122 and the portion of the third passivation layer 123. In other words, the removal of the portion of the first passivation layer 121, the removal of the portion of the second passivation layer 122 and the removal of the portion of the third passivation layer 123 are performed simultaneously.

In some embodiments, the third passivation layer 123 includes a dielectric material such as PI or the like. The third passivation layer 123 may be formed using an electro-chemical plating process, an electroless plating process, PVD, ALD, the like, or a combination thereof.

Figure 15:
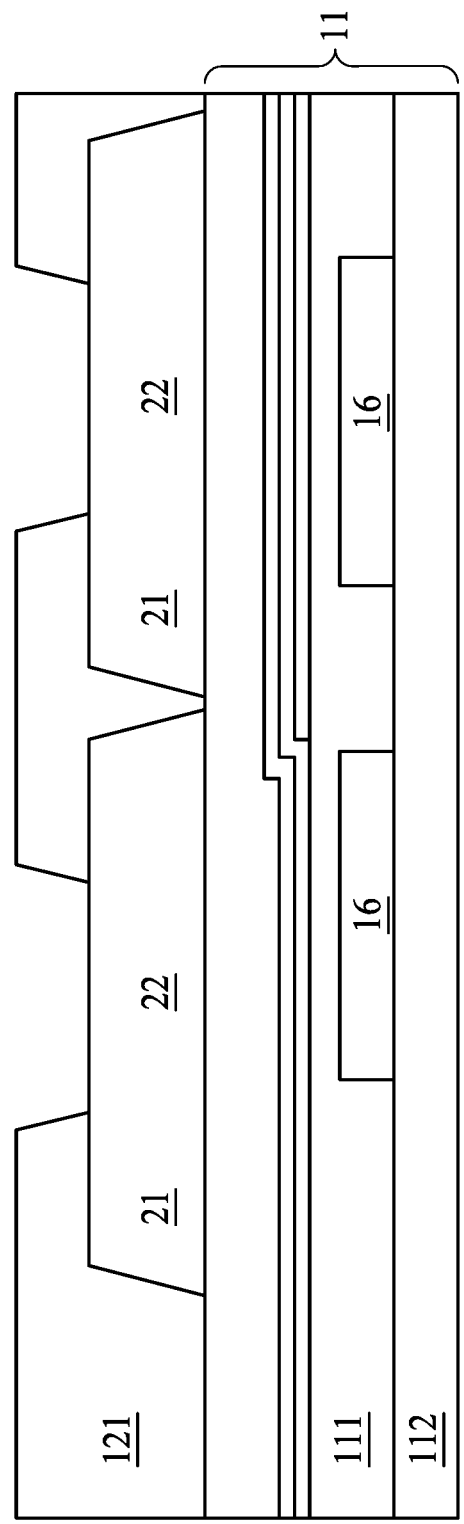
Figure 16:
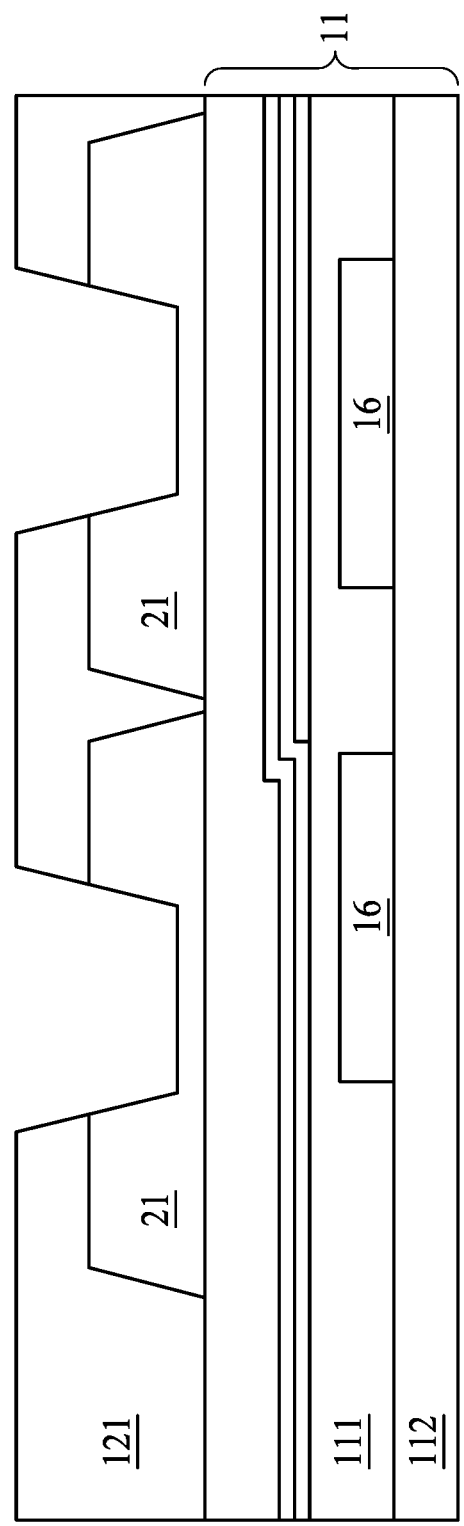
Figure 17:
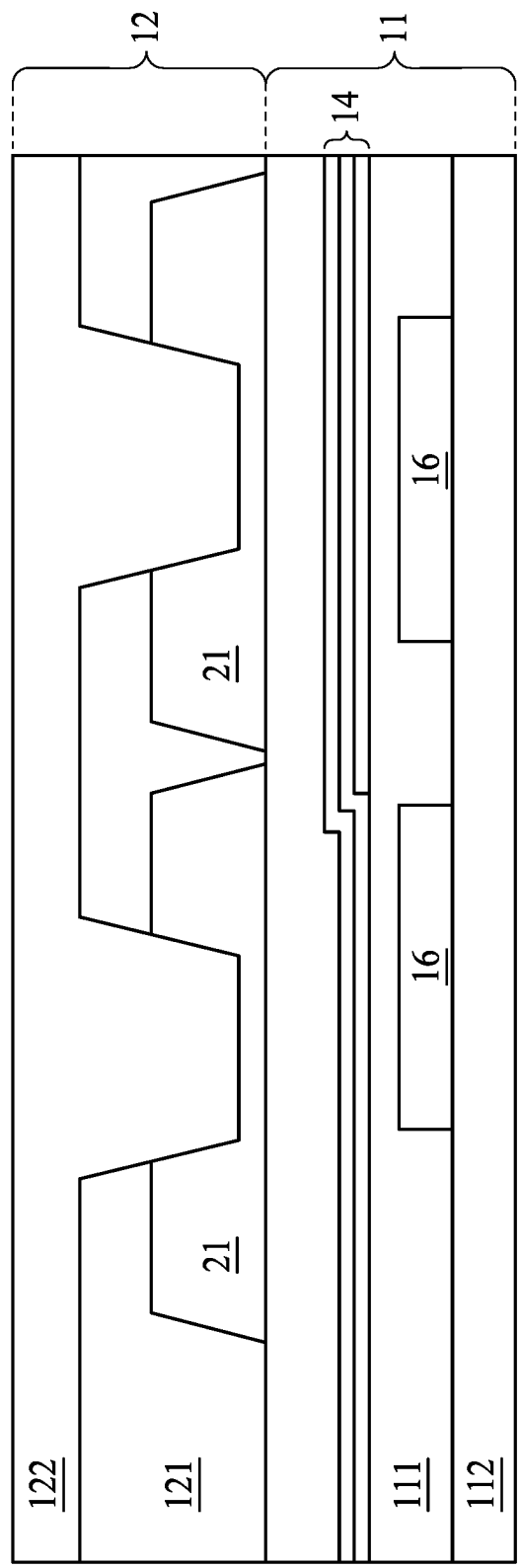
Figure 18:
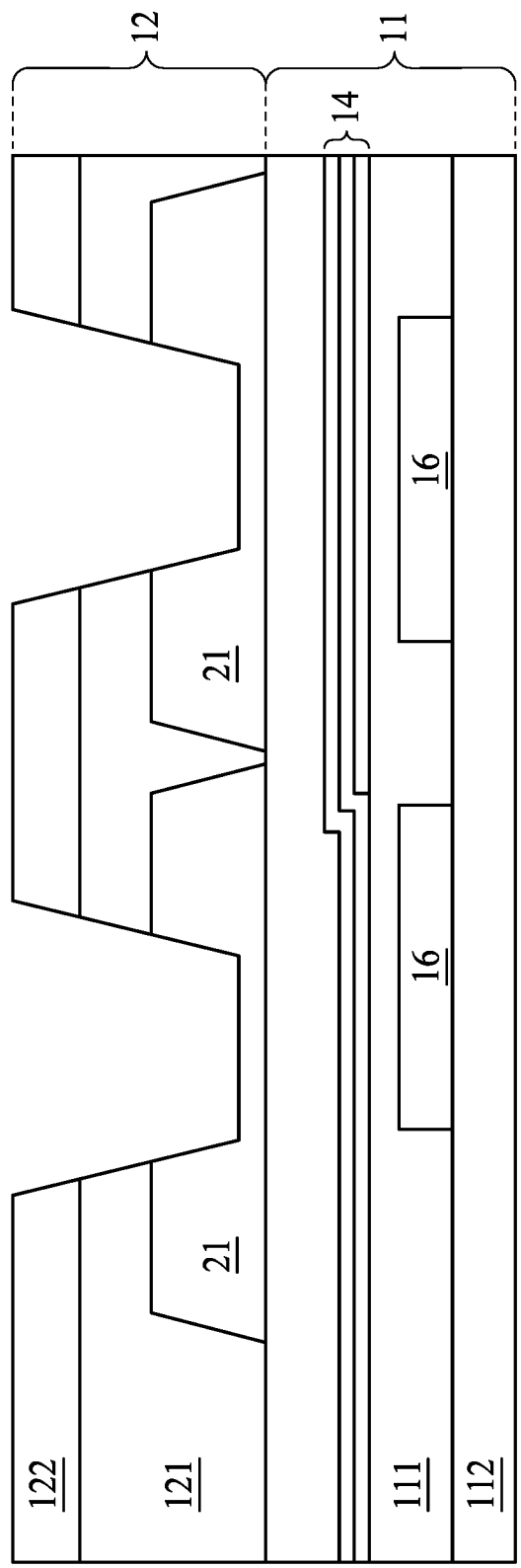
Figure 19:
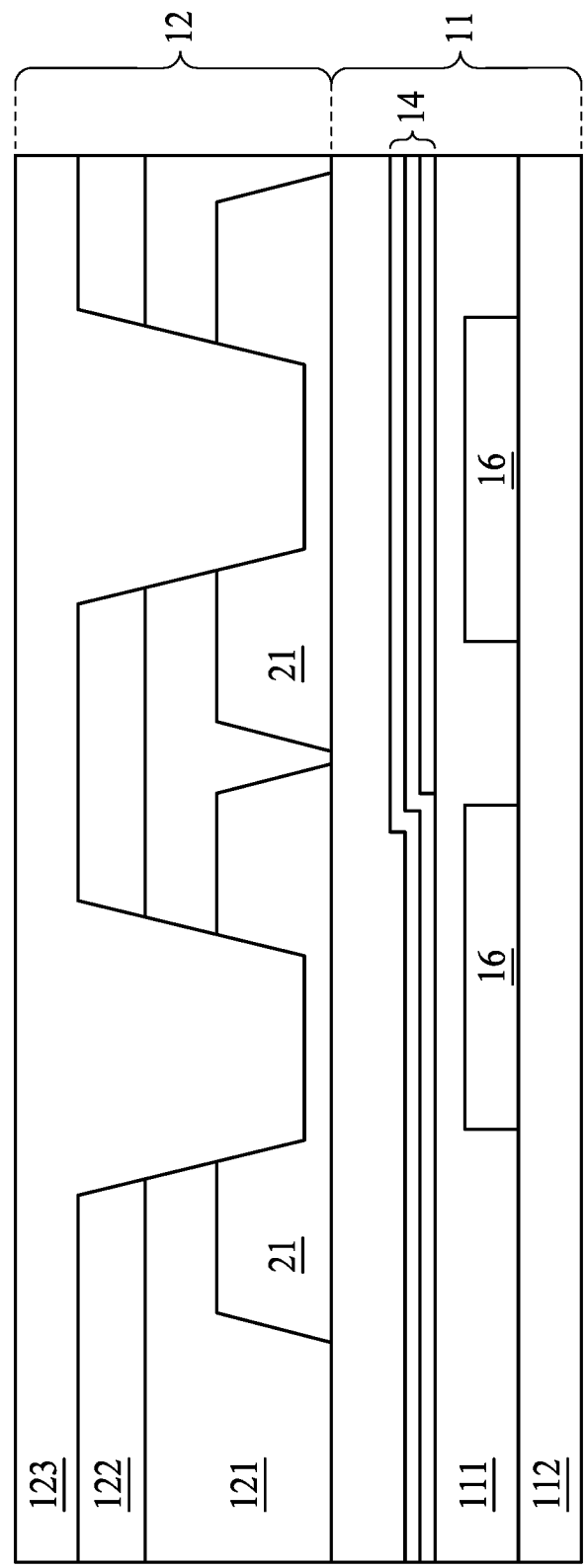

In some embodiments as shown in FIGS. 15 to 20, the formation of the recess 22 (the operations 72 to 75) includes removing a portion of the first passivation layer 121 as shown in FIG. 15, removing a portion of the conductive pad 21 as shown in FIG. 16, disposing a second passivation layer 122 as shown in FIG. 17, removing a portion of the second passivation layer 122 as shown in FIG. 18, disposing a third passivation layer 123 as shown in FIG. 19 and removing a portion of the third passivation layer 123 as shown in FIG. 20.

In some embodiments, the portion of the first passivation layer 121 disposed over the conductive pad 21 is removed, such that at least a portion of the conductive pad 21 is exposed. In some embodiments, a photoresist material (not shown) is formed over the first passivation layer 121. The photoresist material is subsequently irradiated (exposed) to a predetermined electromagnetic radiation through a mask, and then a portion of the photoresist material exposed to the predetermined electromagnetic radiation is removed. Subsequently, the exposed portions of the first passivation layer 121 exposed from the photoresist material are removed using, for example, a suitable etching process to form openings.

In some embodiments, the removal of the portion of the first passivation layer 121 and the removal of the portion of the conductive pad 21 are performed separately as shown in FIGS. 15 to 16. In some embodiments, the removal of the portion of the first passivation layer 121 and the removal of the portion of the conductive pad 21 are performed simultaneously as shown in FIG. 16.

Figure 21:
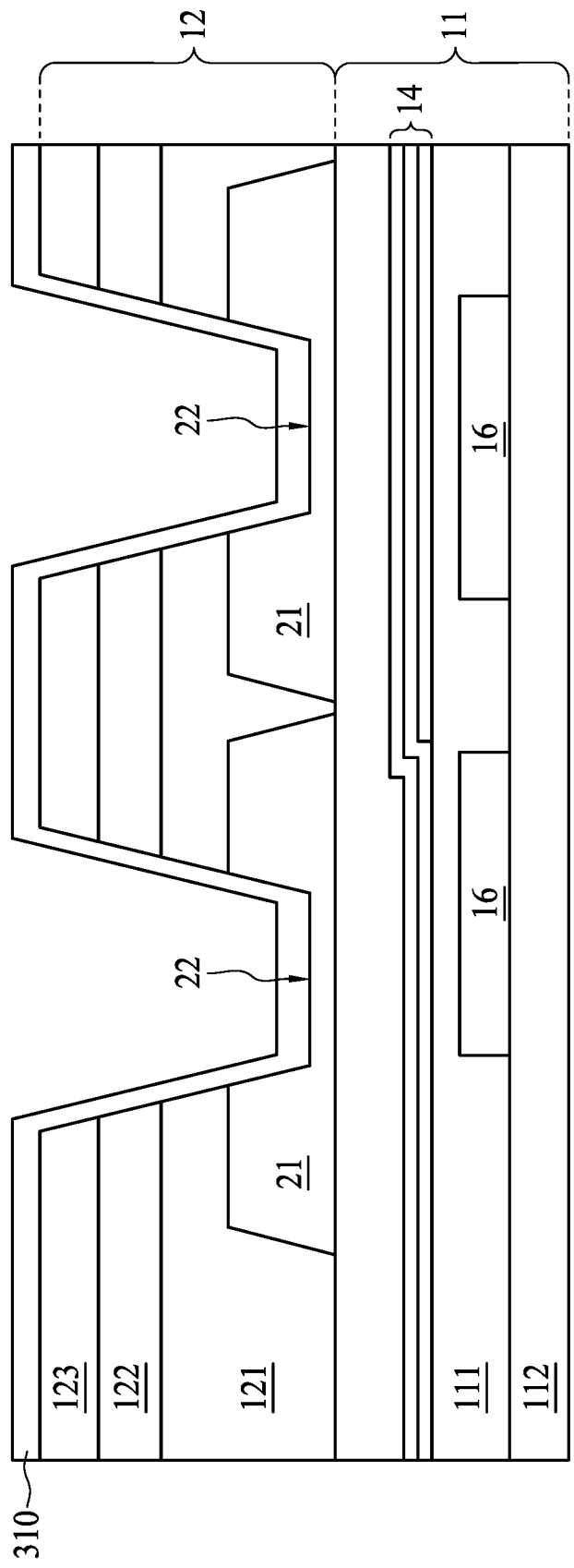
Figure 26:
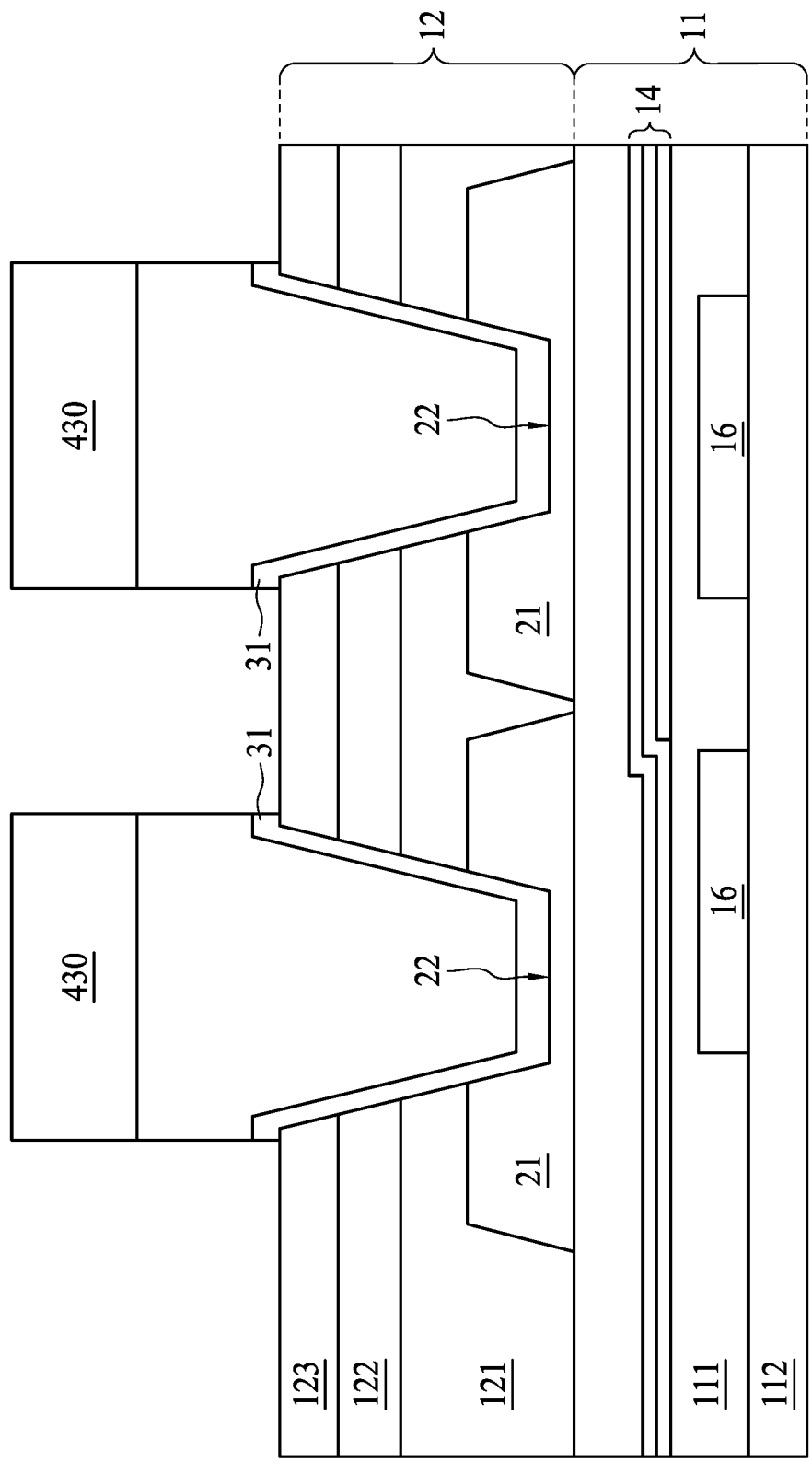

In operation 76, a bump pad 31 is formed over the third passivation 123 and within the recess 22 as shown in FIGS. 21 and 26. In some embodiments, the bump pad 31 is formed over the third passivation 123 and the exposed portion of the conductive pad 21. In some embodiments, the formation of the bump pad 31 includes disposing a UBM layer 310 over the third passivation layer 123 and within the recesses 22 as shown in FIG. 21. In some embodiments, the UBM layer 310 is disposed by PVD, sputtering, evaporation, electroplating or any other suitable operation.

Figure 22:
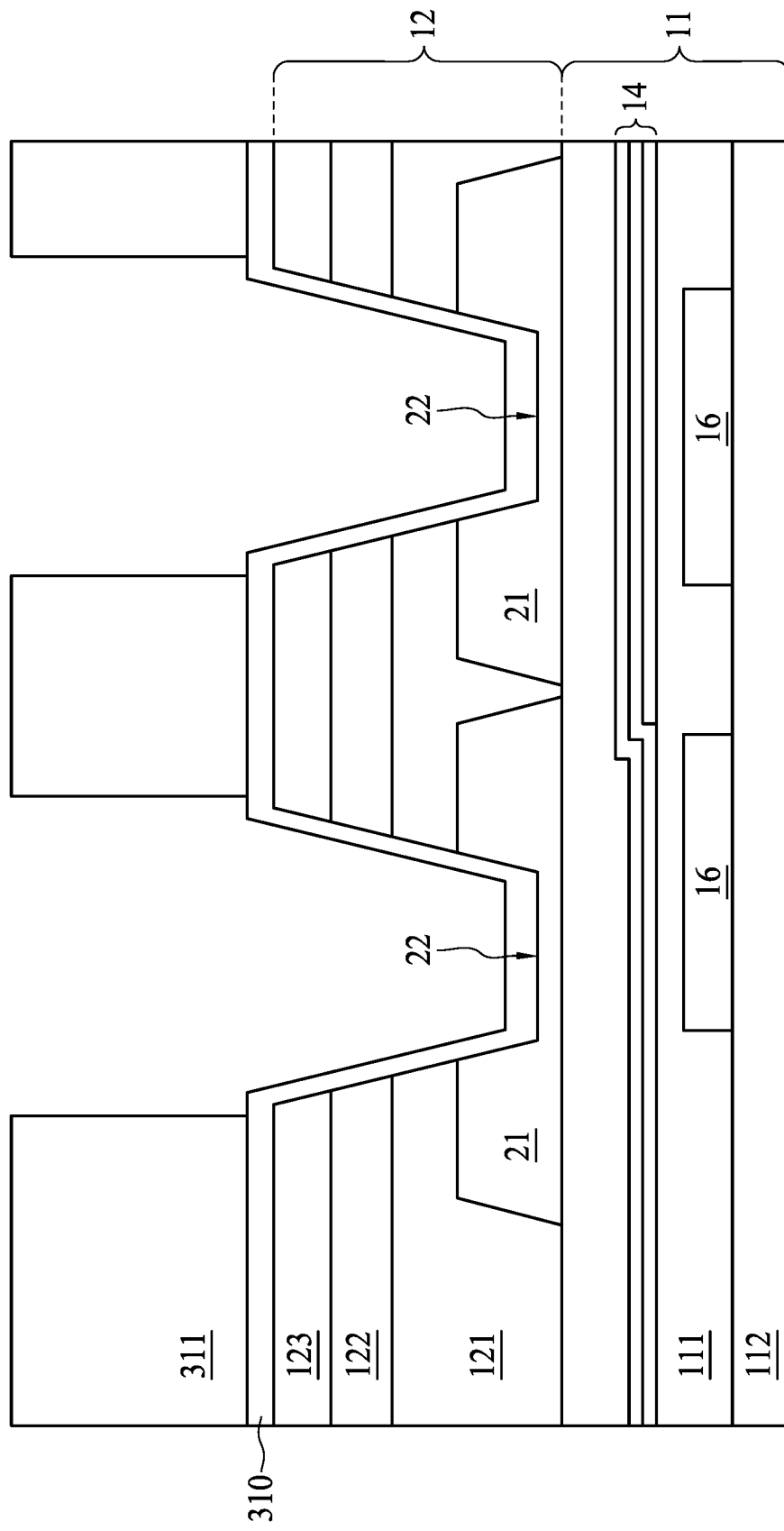

In some embodiments, a photoresist material 311 is disposed over the UBM layer 310, and then the photoresist material 311 is patterned as shown in FIG. 22. In some embodiments, the photoresist material 311 is formed over the UBM layer 310. In some embodiments, the photoresist material 311 is disposed by spin coating, sputtering or any other suitable operation. The photoresist material 311 is subsequently irradiated (exposed) and developed to remove a portion of the photoresist material 311.

Figure 23:
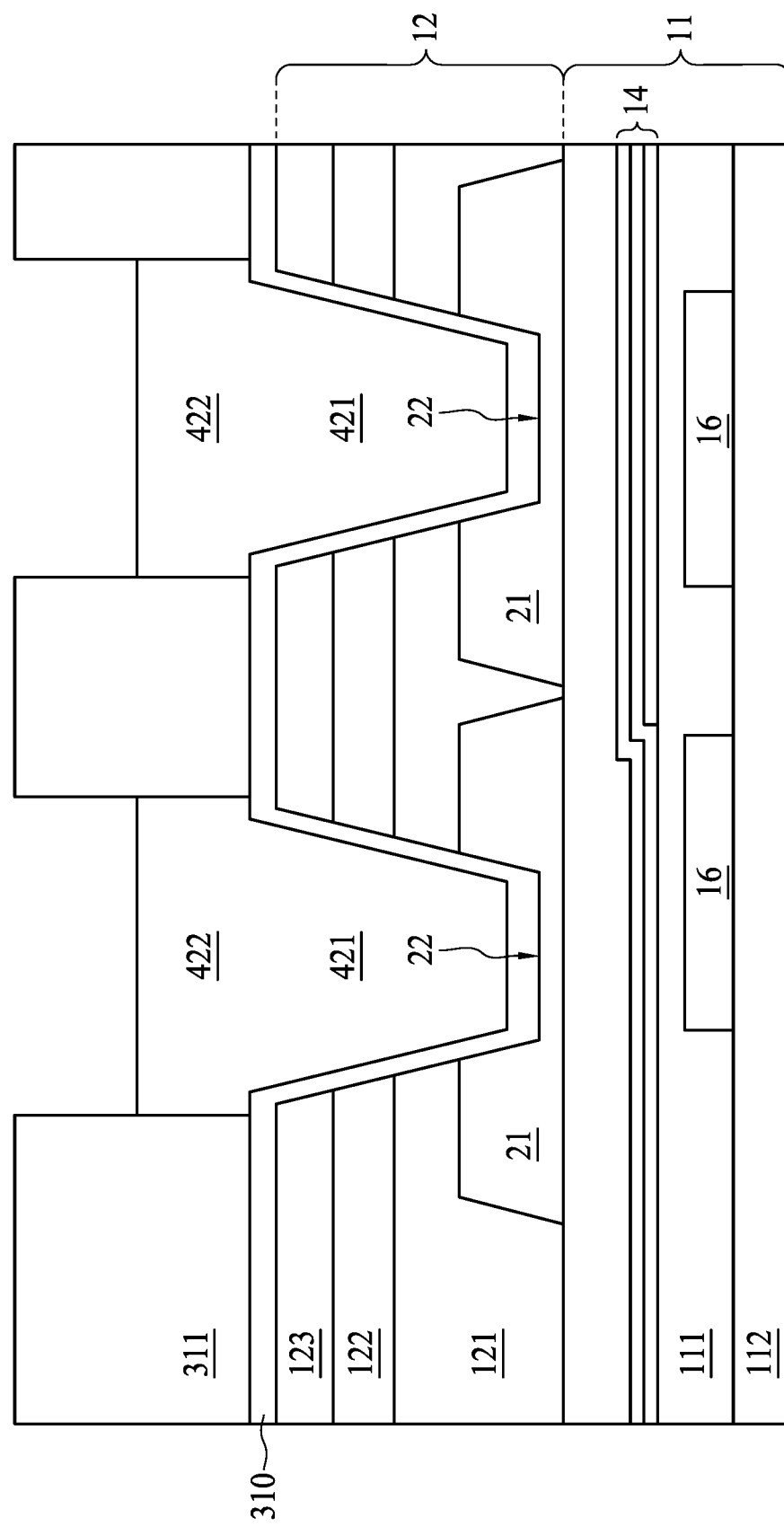

In operation 77, a conductive bump 41 is formed over the bump pad 31 as shown in FIGS. 23 to 27. FIG. 23 illustrates the conductive pillar 42 is formed on at least a portion of the UMB layer 310 after the patterning of the photoresist 311. In some embodiments, the conductive pillar 42 is formed by disposing a conductive material over the UMB layer 310 exposed through the photoresist 311. In some embodiments, the conductive material is disposed by sputtering, plating, electroplating or any other suitable operation. In some embodiments, the conductive pillar 42 includes a first end portion 421 formed in the recess 22 and a second end portion 422 formed on the first end portion 421.

Figure 24:
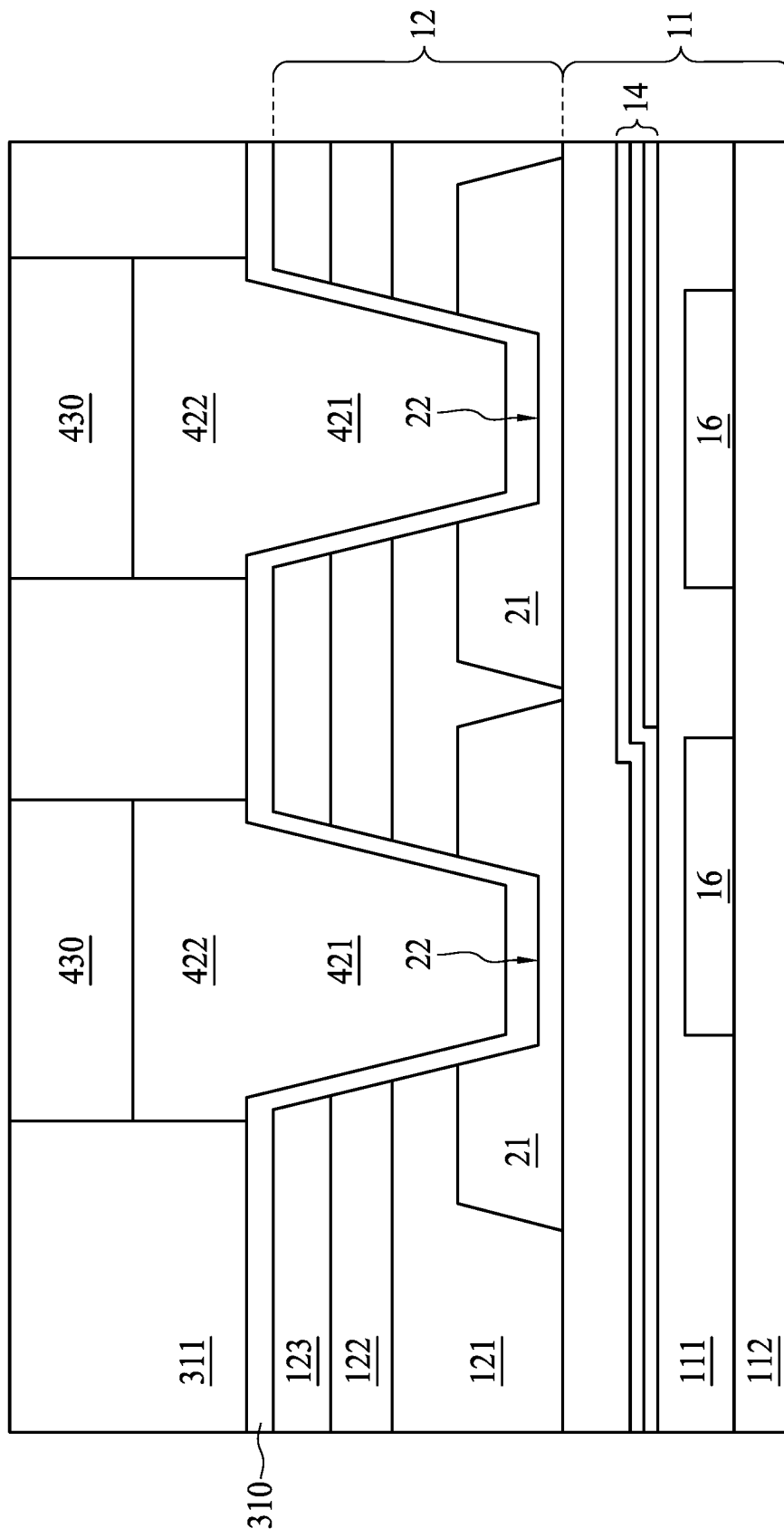

In some embodiments, a soldering member 43 is formed over the second end portion 422 of the conductive pillar 42 as shown in FIGS. 24 to 27. In some embodiments, as shown in FIG. 24, the soldering member 43 is formed by disposing a solder paste mixture 430 of metallic powders and flux over the second end portion 422 of the conductive pillar 42 exposed through the photoresist 311. In some embodiments, the solder paste mixture 430 is disposed by stencil pasting, plating, electroplating or any other suitable operation.

Figure 25:
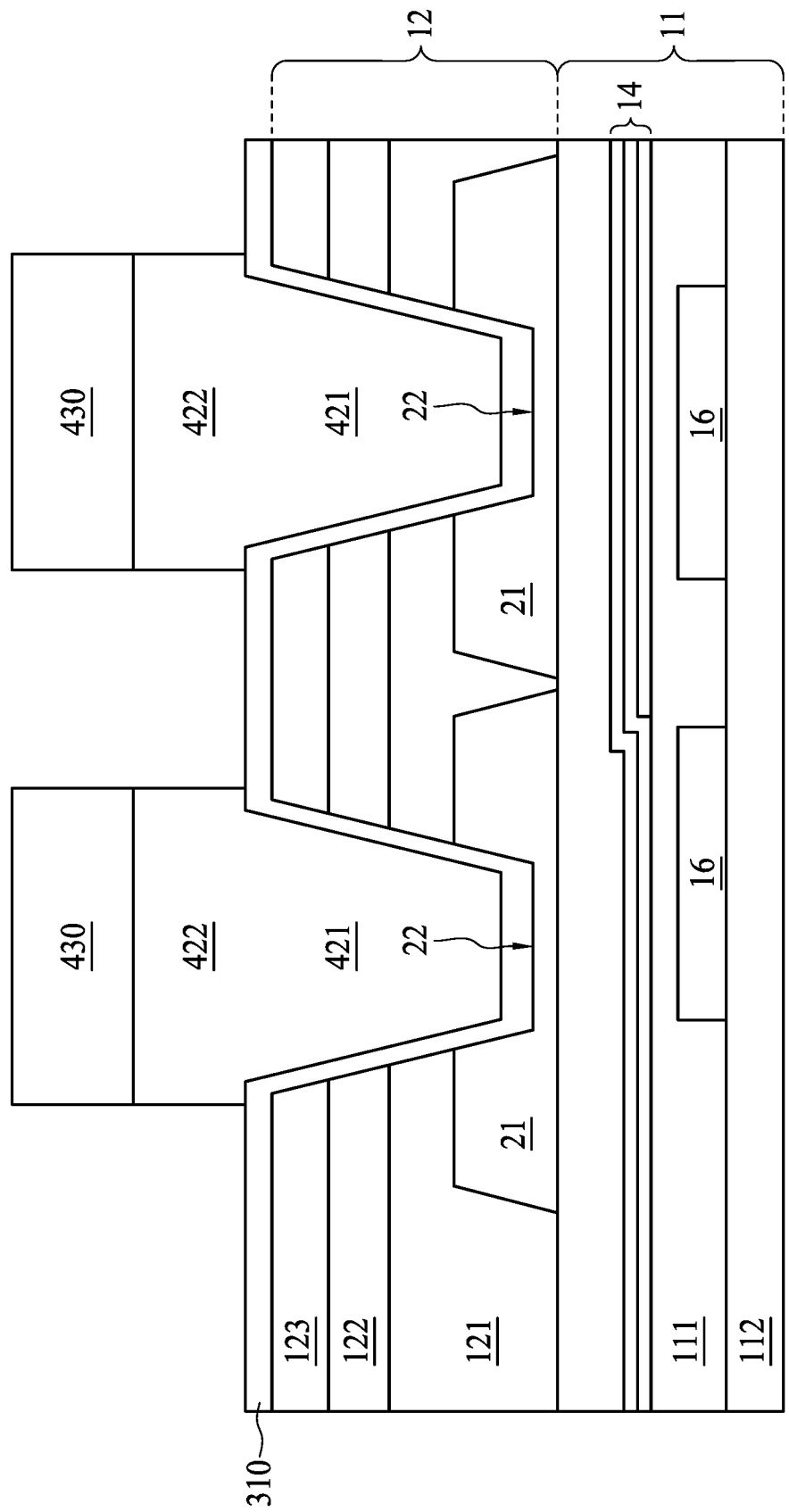

In some embodiments, as shown in FIG. 25, the patterned photoresist 311 is removed. In some embodiments, the patterned photoresist 311 is removed by stripping, etching or any other suitable operation.

In some embodiments, as shown in FIG. 26, the portion of the UBM layer 310 not covered by the second end portion 422 of the conductive pillar 42 may be removed through a suitable etching process. In some embodiments, the bump pad 31 is formed after the removal of the portion of the UBM layer 310.

Figure 27:
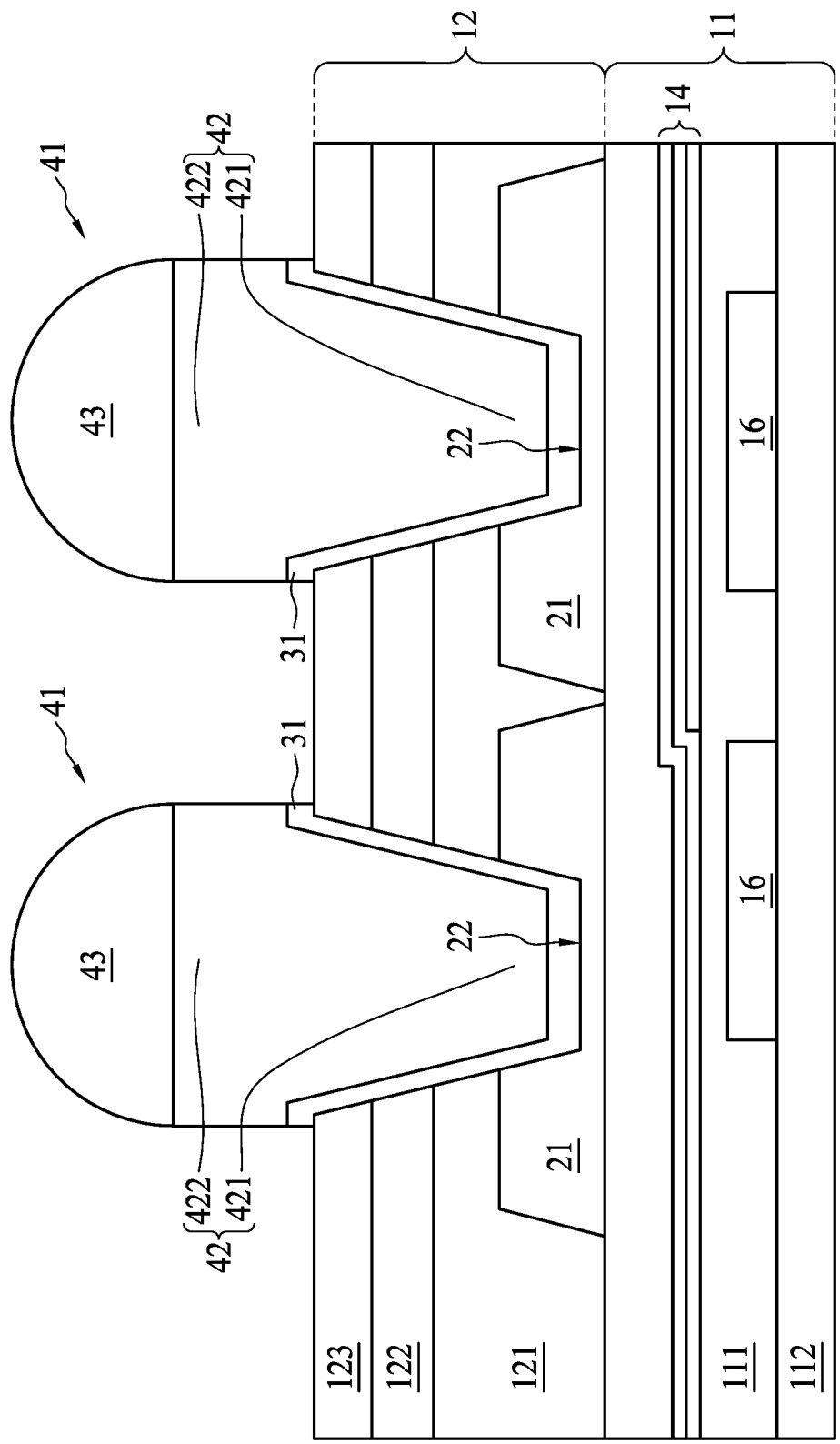

In some embodiments, as shown in FIG. 27, the conductive bump 41 is formed. In some embodiments, after the solder paste mixture 430 is reflowed or cured, the soldering member 43 is formed in a dome or hemispherical shape. In some embodiments, a first semiconductor structure 100 as shown in FIG. 1 is formed.

FIGS. 28 to 35 are cross-sectional views illustrating exemplary operations for providing a semiconductor structure of the present disclosure. In some embodiments, the operations of FIGS. 28 to 35 may be used to provide or manufacture the semiconductor structure illustrated in FIG. 5.

Figure 28:
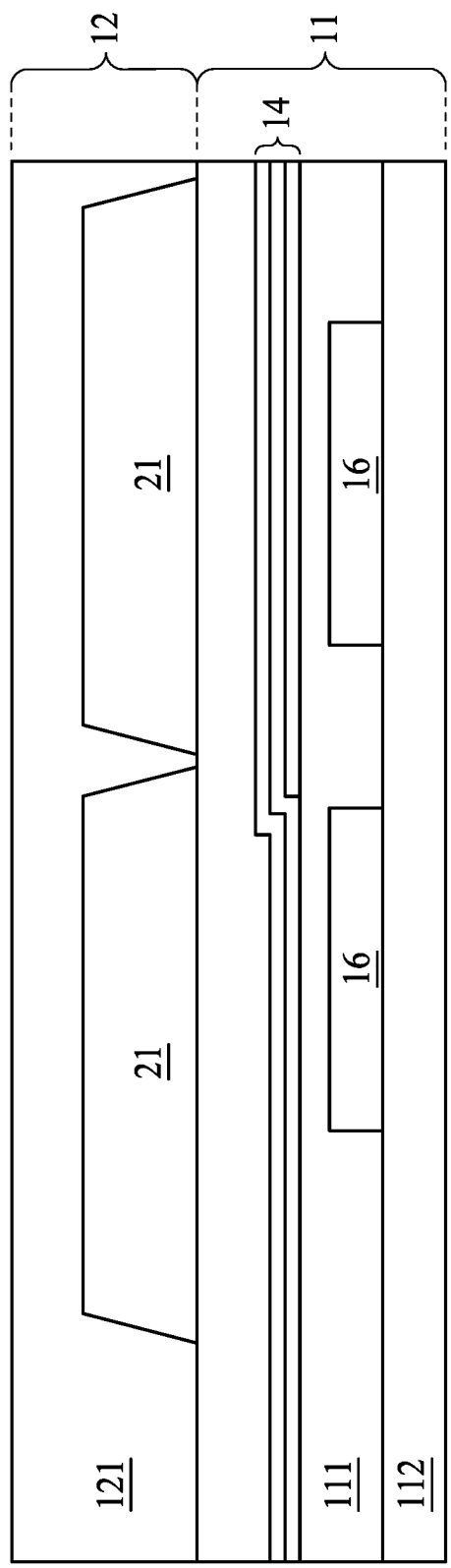
FIGS. 28 to 35 are cross-sectional views of a semiconductor structure manufactured at various stages in accordance with some embodiments of the present disclosure.

Operation shown in FIG. 28 is similar to the operation 71 shown in FIG. 8, and is not described again herein.

Figure 29:
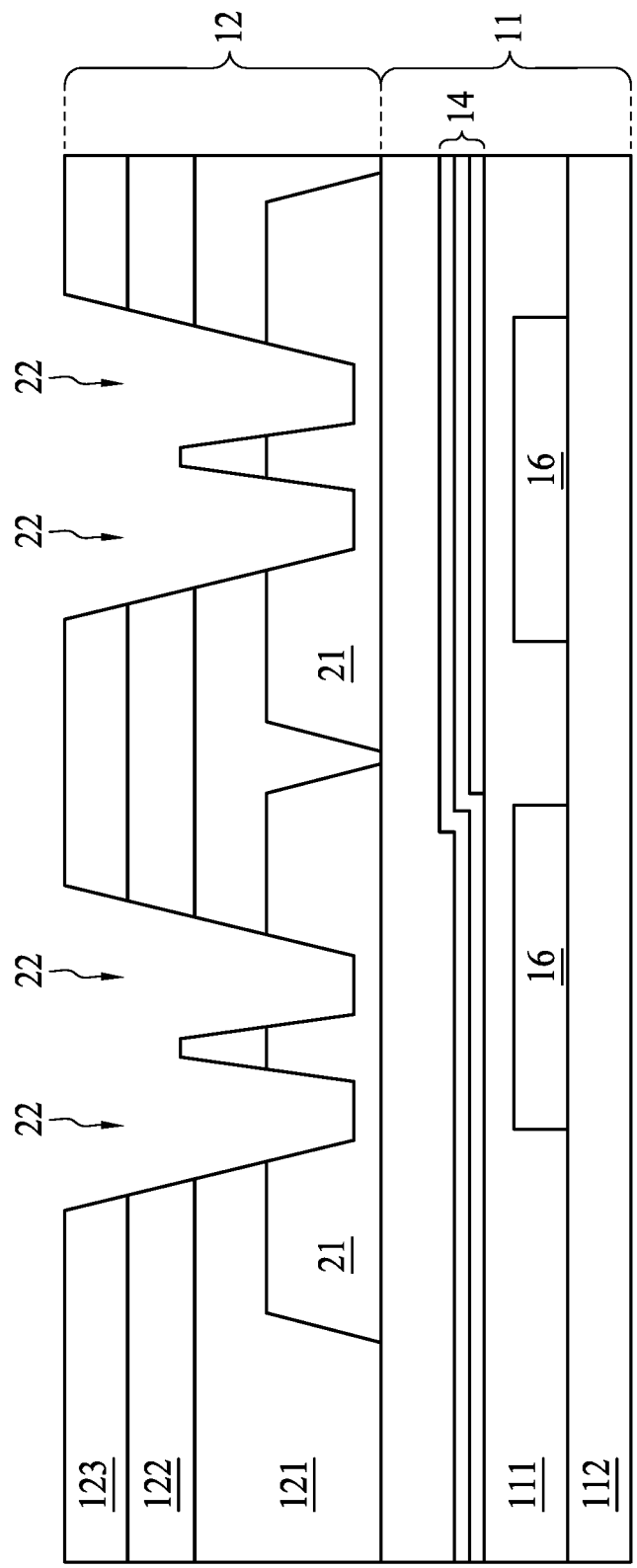

Operation shown in FIG. 29 is similar to the operations 72 to 75 shown in FIGS. 9-20. In some embodiments, the recesses 22 extending through the passivation 12 and into the conductive pad 21 are formed as shown in FIG. 29. The recesses 22 configured to receive a subsequently-formed bump pad 31. In some embodiments, portions of the passivation 12 disposed over the conductive pad 21 are removed, and portions of the underlying conductive pads 21 are exposed. In some embodiments, the passivation 12 includes the first passivation layer 121 and the second passivation layer 122. In some embodiments, the passivation 12 includes the first passivation layer 121, the second passivation layer 122 and the third passivation layer 123.

In some embodiments, formation of the second passivation layer 122 and the third passivation layer 123 may be before or after the removing of portions of the first passivation layer 121. Formation of the second passivation layer 122 and the third passivation layer 123 may be before or after the removing of portions of the conductive pas 21. The portions of the first passivation layer 121, the portions of the second passivation layer 122, portions of the third passivation layer 123 may be removed separately or simultaneously as described above. Portions of the conductive pads 21 may be removed after the removal of portions of the passivation 12. In some embodiments, the recesses 22 are formed after the removal of the portions of the first passivation layer 121, the removal of the portions of the second passivation layer 122, the removal of the third passivation layer 123, and the removal of the portions of the corresponding conductive pad 21.

Figure 30:
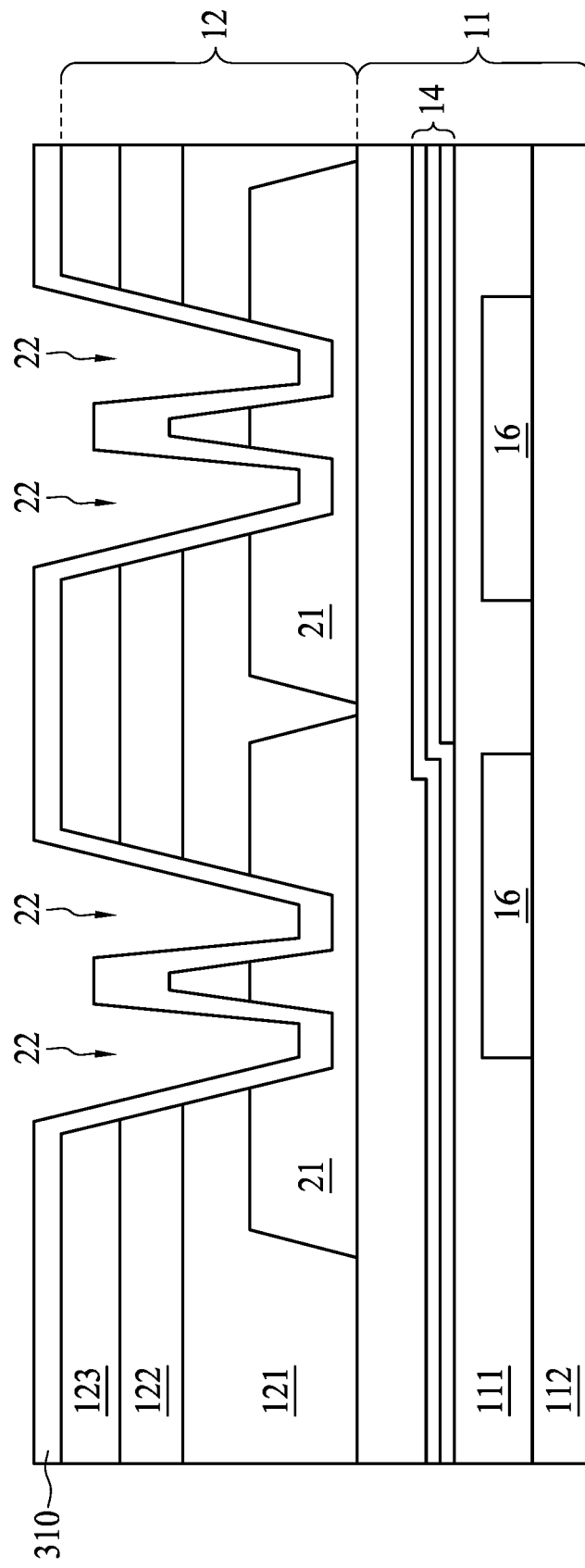

Operation shown in FIG. 30 is similar to the operation 76 shown in FIG. 21. In some embodiments, a bump pad 31 is formed over the third passivation 123 and within the recesses 22 as shown in FIGS. 30 to 34. In some embodiments, the bump pad 31 is formed over the third passivation 123 and the exposed portions of the conductive pad 21. In some embodiments, the formation of the bump pad 31 includes disposing a UBM layer 310 over the third passivation layer 123 and within the recesses 22 as shown in FIG. 30. In some embodiments, the UBM layer 310 is disposed by PVD, sputtering, evaporation, electroplating or any other suitable operation.

Figure 31:
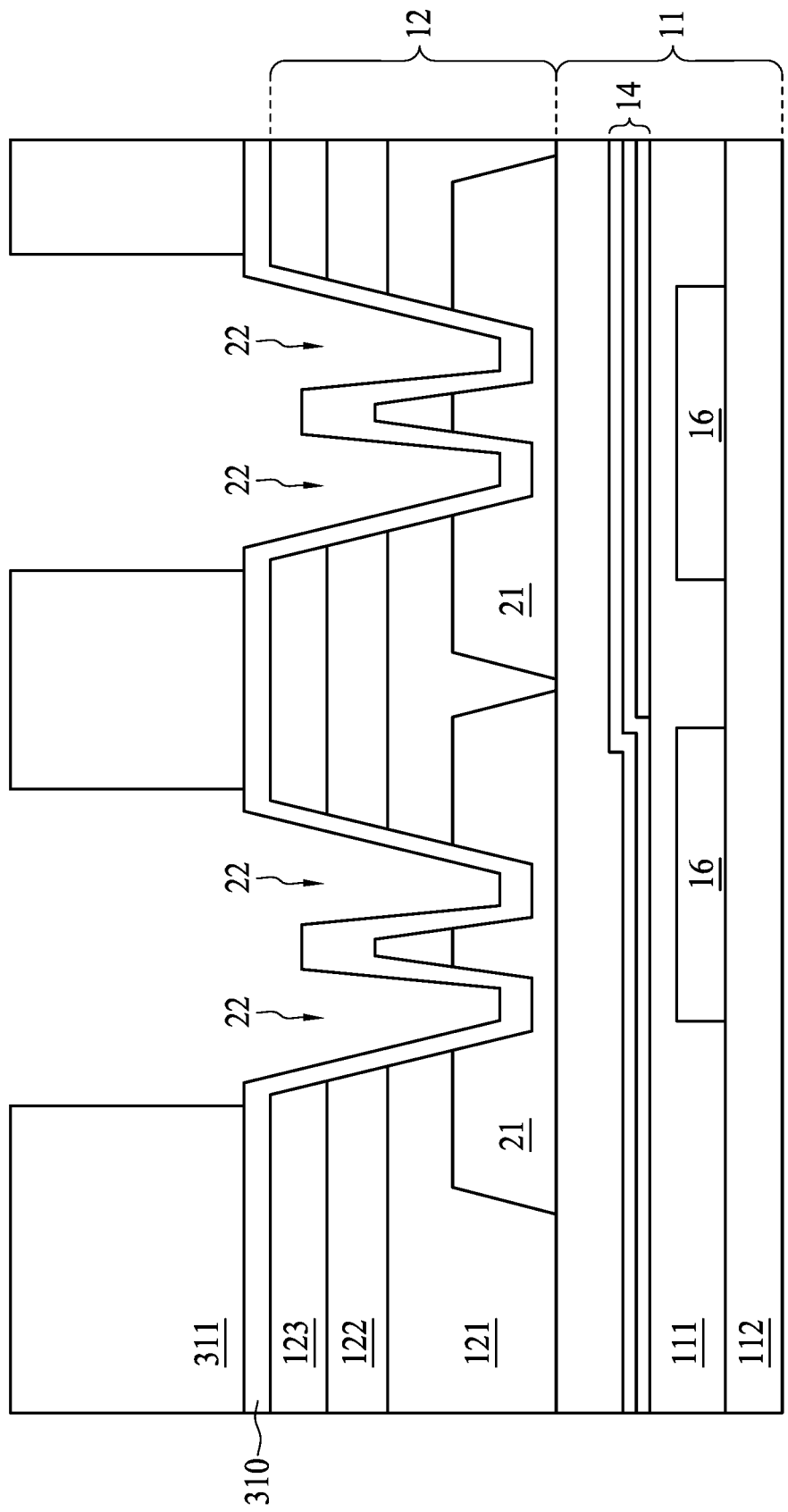

In some embodiments, a photoresist material 311 is disposed over the UBM layer 310, and then the photoresist material 311 is patterned as shown in FIG. 31. In some embodiments, the photoresist material 311 is formed over the UBM layer 310. In some embodiments, the photoresist material 311 is disposed by spin coating, sputtering or any other suitable operation. The photoresist material 311 is subsequently irradiated (exposed) and developed to remove a portion of the photoresist material 311.

Figure 32:
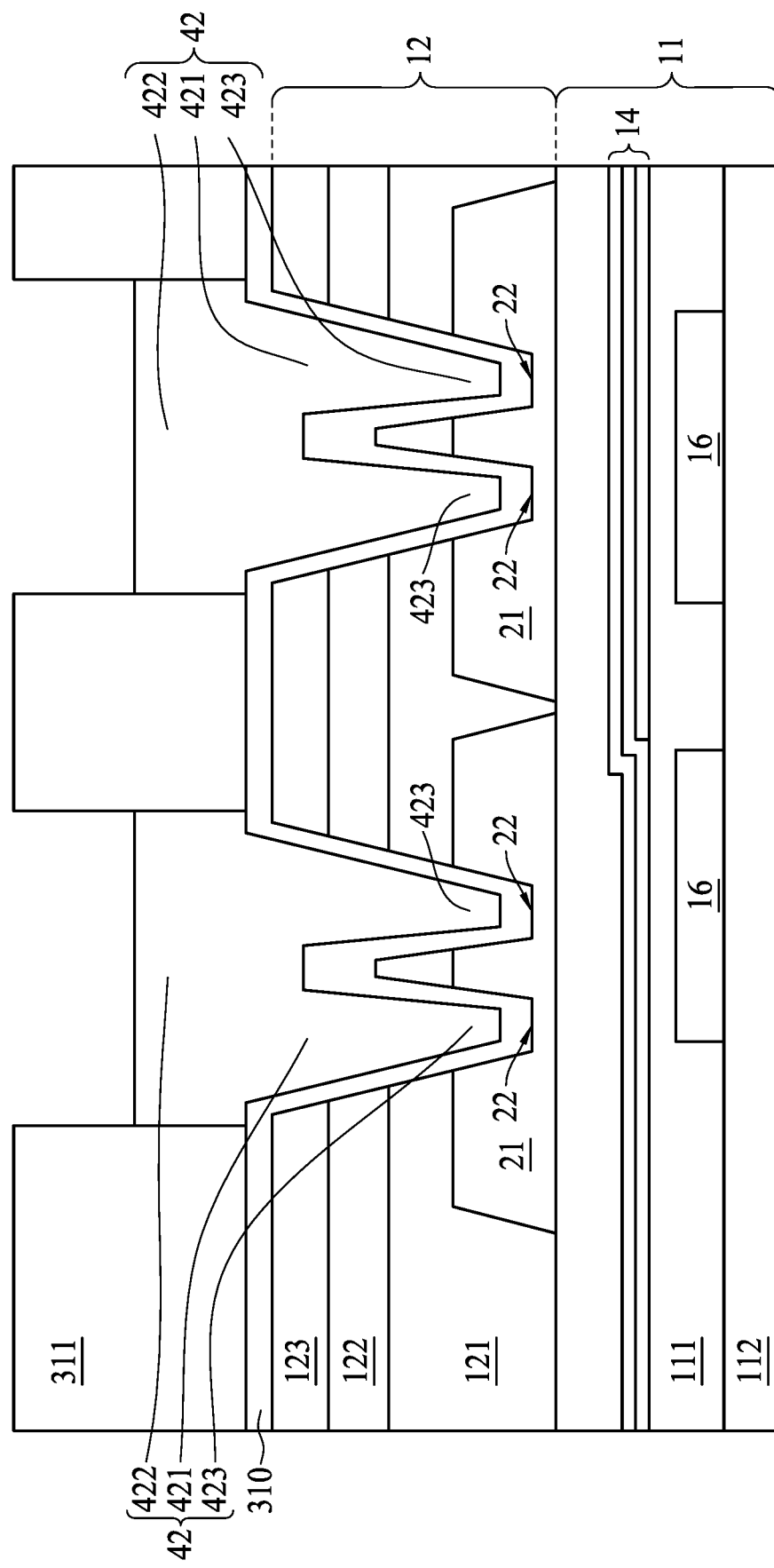
Figure 33:
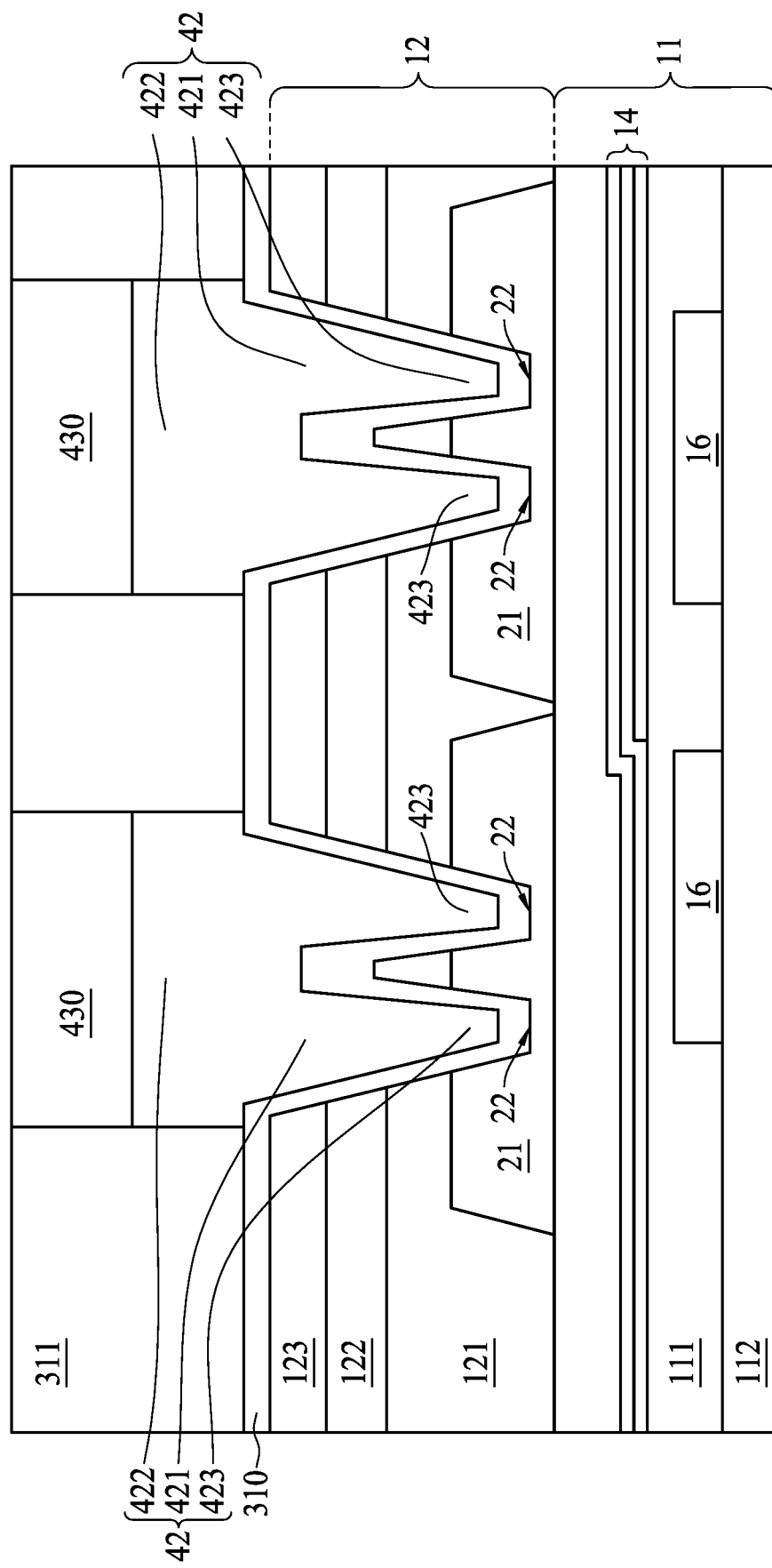
Figure 34:
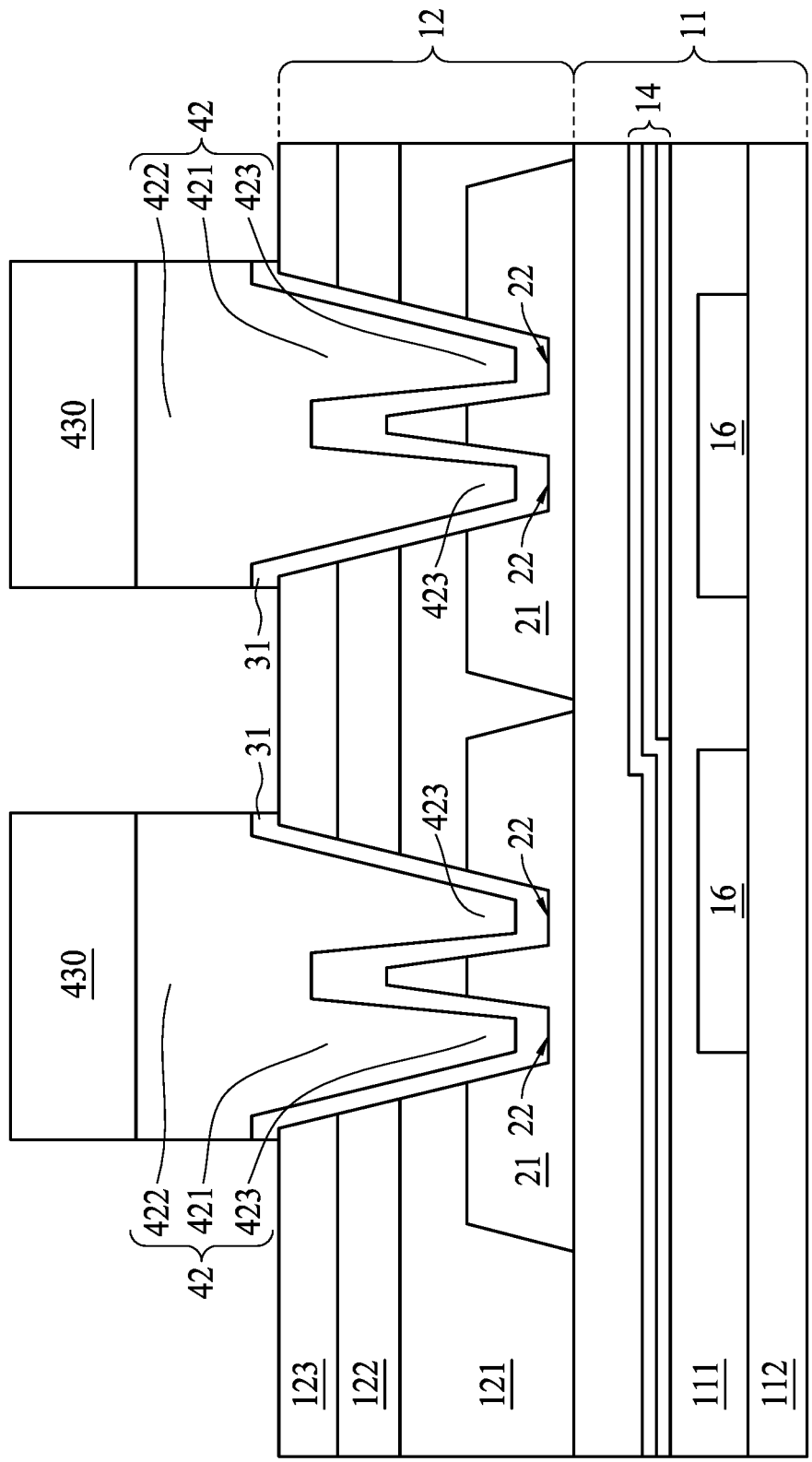
Figure 35:
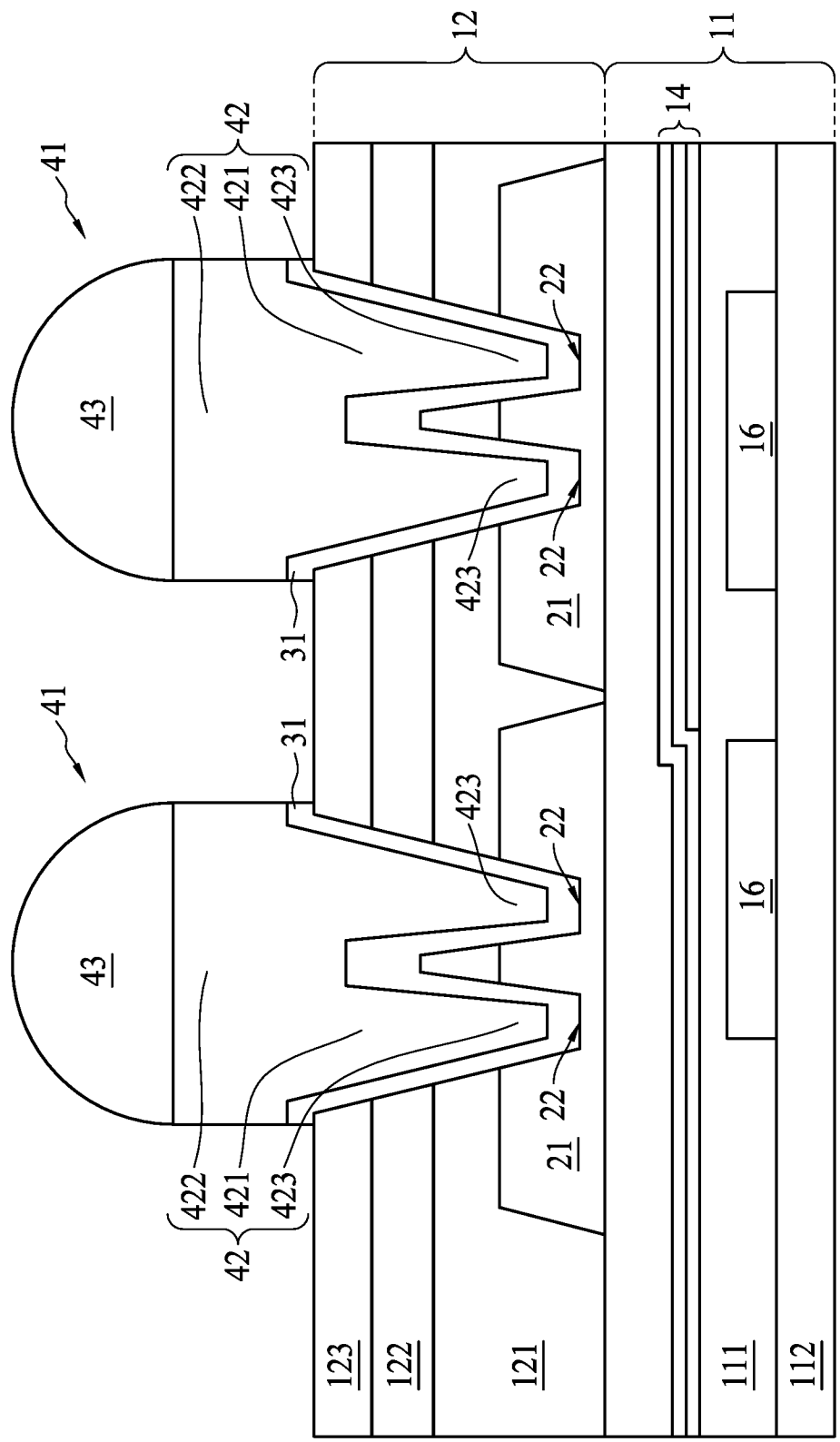

Operations shown in FIGS. 32 to 35 are similar to the operation 77 shown in FIGS. 22 to 27. In some embodiments as shown in FIG. 32, the conductive pillar 42 is formed on at least a portion of the UMB layer 310 after the patterning of the photoresist 311. In some embodiments, the conductive pillar 42 is formed by disposing a conductive material over the UMB layer 310 exposed through the photoresist 311. In some embodiments, the conductive material is disposed by sputtering, plating, electroplating or any other suitable operation. In some embodiments, the conductive pillar 42 includes a first end portion 421 formed in the recess 22 and a second end portion 422 of the conductive pillar 42 is formed on the first end portion 421. In some embodiments, the first end portion 421 of the conductive pillar 42 includes a plurality of posts 423 respectively extending into the plurality of recesses 22. In some embodiments, a fifth semiconductor structure 500 as shown in FIG. 5 is formed.

Accordingly, the present disclosure provides a semiconductor structure and a method of manufacturing a semiconductor structure. The semiconductor structure includes a substrate, a conductive pad, a passivation layer, a recess, a bump pad, and a conductive bump. The recess extends through the passivation layer and extends at least partially into the conductive pad, the bump pad is disposed over the passivation layer and within the recess; and the conductive bump is disposed over the bump pad. Consequently, the semiconductor structure can minimize, prevent, and/or stop the spreading of cracks arising due to external forces or CTE mismatch.

Some embodiments of the present disclosure provide a semiconductor structure including a substrate, a conductive pad, a passivation layer, a recess, a bump pad, and a conductive bump. The conductive pad is disposed over the substrate. The passivation layer is disposed over the substrate and partially covers the conductive pad. The recess extends through the passivation layer and extends at least partially into the conductive pad. The bump pad is disposed over the passivation layer and within the recess, and the conductive bump is disposed over the bump pad.

Some embodiments of the present disclosure provide a semiconductor structure including a substrate, a conductive pad, a passivation layer, a plurality of recesses, a bump pad, and a conductive bump. The conductive pad is disposed over the substrate. The passivation layer is disposed over the substrate and partially covers the conductive pad. The plurality of recesses extend through the passivation layer and extend at least partially into the conductive pad. The bump pad is disposed over the passivation 12 and within the plurality of recesses. The conductive bump is disposed over the bump pad. The conductive bump includes a plurality of conductive pillars respectively extending within the plurality of recesses.

Some embodiments of the present disclosure provide a method for manufacturing a semiconductor structure. The method includes providing a substrate including a conductive pad disposed over the substrate and a first passivation layer over the substrate and the conductive pad; removing a portion of the first passivation layer disposed over the conductive pad; removing a portion of the conductive pad; disposing a second passivation layer over the first passivation layer and the conductive pad; removing a portion of the second passivation layer disposed over the conductive pad; forming a bump pad over the second passivation layer and the conductive pad; and forming the conductive bump over the bump pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, composition of matter, means, methods, and steps.

What is claimed is:

1. A semiconductor structure, comprising:
    a substrate;
    a conductive pad disposed over the substrate;
    a passivation disposed over the substrate and partially covering the conductive pad;
    a plurality of recesses extending through the passivation and extending at least partially into the conductive pad;
    a bump pad disposed over the passivation and within the plurality of recesses; and
    a conductive bump disposed over the bump pad;
    wherein the conductive bump includes a plurality of conductive pillars respectively extending within the plurality of recesses and surrounded by the conductive pad, and at least a portion of the bump pad is disposed between two of the plurality of conductive pillars.

2. The semiconductor structure of claim 1, wherein the conductive pad surrounds a portion of the conductive bump.

3. The semiconductor structure of claim 1, wherein a portion of the bump pad is disposed conformal to the plurality of recesses.

4. The semiconductor structure of claim 1, wherein a portion of the conductive bump and a portion of the bump pad are exposed through the passivation.

5. The semiconductor structure of claim 1, wherein the conductive bump includes a soldering member disposed over the conductive pillars.

6. The semiconductor structure of claim 5, wherein a first end portion of each of the plurality of conductive pillars is surrounded by the conductive pad and the bump pad, and a second end portion of each of the plurality of conductive pillars opposite to the first end portion is coated with the soldering member.

7. The semiconductor structure of claim 1, wherein the thickness of the conductive pad is substantially greater than 25000 Å.

8. The semiconductor structure of claim 1, wherein a portion of the bump pad is disposed within the conductive pad.

9. The semiconductor structure of claim 1, wherein a portion of the passivation is disposed within the conductive pad.

10. A semiconductor structure, comprising:
    a substrate;
    a conductive pad disposed over the substrate;
    a passivation disposed over the substrate and partially covering the conductive pad;
    a plurality of recesses extending through the passivation and extending at least partially into the conductive pad;
    a bump pad disposed over the passivation and within the plurality of recesses; and
    a conductive bump disposed over the bump pad;
    wherein the conductive bump includes a plurality of conductive pillars respectively extending within the plurality of recesses and surrounded by the conductive pad.

11. The semiconductor structure of claim 10, wherein at least a portion of the bump pad is disposed conformal to the plurality of recesses.

12. The semiconductor structure of claim 10, wherein at least a portion of the passivation is disposed between two of the plurality of recesses.

13. The semiconductor structure of claim 10, wherein the passivation includes a first passivation layer disposed over the substrate and partially covers the conductive pad, and a second passivation layer disposed over the first passivation layer;
and wherein at least a portion of the first passivation layer and at least a portion of the second passivation layer are disposed between two of the plurality of recesses.

14. The semiconductor structure of claim 10, wherein at least a portion of the conductive pad is disposed between two of the plurality of conductive pillars.

15. A method of manufacturing a semiconductor structure, comprising:
providing a substrate including a conductive pad disposed over the substrate and a first passivation layer over the substrate and the conductive pad;
removing a portion of the first passivation layer disposed over the conductive pad;
removing a portion of the conductive pad to form a plurality of recesses extending at least partially into the conductive pad;
disposing a second passivation layer over the first passivation layer and the conductive pad;
removing a portion of the second passivation layer disposed in the recesses;
forming a bump pad in the recesses and over the second passivation layer and the conductive pad; and
forming the conductive bump over the bump pad, wherein the conductive bump includes a plurality of conductive pillars respectively extending within the plurality of recesses and surrounded by the conductive pad.

16. The method of claim 15, wherein the plurality of recesses extending through the first passivation layer and the second passivation layer is formed after the removal of the portion of the first passivation layer, the removal of the portion of the second passivation layer and the removal of the portion of the conductive pad.

17. The method of claim 15, wherein the removal of the portion of the first passivation layer and the removal of the portion of the conductive pad are performed separately or simultaneously.

18. The method of claim 15, wherein the removal of the portion of the conductive pad and the removal of the portion of the second passivation layer are performed separately or simultaneously.

19. The method of claim 15, wherein the removal of the portion of the conductive pad is performed prior to the removal of the portion of the second passivation layer.

20. The method of claim 15, further comprising removing a portion of the bump pad after the conductive bump is formed.

* * * * *